United States Patent
Kwon

(10) Patent No.: US 9,984,032 B2
(45) Date of Patent: May 29, 2018

(54) SYSTEM ON PACKAGE (SOP) HAVING THROUGH SILICON VIA (TSV) INTERPOSER WITH MEMORY CONTROLLER CONNECTED TO MULTIPLE PRINTED CIRCUIT BOARDS (PCB)

(71) Applicant: SAMSUNG ELECTRONICS CO., LTD., Suwon-si, Gyeonggi-Do (KR)

(72) Inventor: Heung Kyu Kwon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 148 days.

(21) Appl. No.: 15/242,648

(22) Filed: Aug. 22, 2016

(65) Prior Publication Data
US 2017/0068633 A1 Mar. 9, 2017

(30) Foreign Application Priority Data
Sep. 8, 2015 (KR) .................. 10-2015-0127222

(51) Int. Cl.
*G06F 13/40* (2006.01)
*G11C 11/401* (2006.01)
*G06F 3/06* (2006.01)
*H01L 25/065* (2006.01)

(52) U.S. Cl.
CPC ........ *G06F 13/4068* (2013.01); *G06F 3/0613* (2013.01); *G06F 3/0631* (2013.01); *G06F 3/0683* (2013.01); *G11C 11/401* (2013.01); *H01L 25/0657* (2013.01); *G11C 2207/105* (2013.01); *H01L 2224/16225* (2013.01); *H01L 2224/32225* (2013.01); *H01L 2224/73204* (2013.01); *H01L 2224/73253* (2013.01); *H01L 2225/06513* (2013.01); *H01L 2225/06517* (2013.01); *H01L 2225/06541* (2013.01); *H01L 2924/15311* (2013.01); *H01L 2924/181* (2013.01)

(58) Field of Classification Search
CPC .................................. G06F 13/4068
See application file for complete search history.

(56) References Cited

U.S. PATENT DOCUMENTS

| | | |
|---|---|---|
| 7,057,911 B2 | 6/2006 | Klint |
| 7,466,603 B2 | 12/2008 | Ong |
| 7,716,411 B2 | 5/2010 | Panabaker et al. |
| 8,355,284 B2 | 1/2013 | Dudte et al. |
| 8,611,123 B2 | 12/2013 | Koh |
| 8,811,101 B2 | 8/2014 | Yang et al. |

(Continued)

*Primary Examiner* — Tammara R Peyton
(74) *Attorney, Agent, or Firm* — Volentine, Whitt & Francos, PLLC

(57) ABSTRACT

A system on package includes a first package and a second package stacked on the first package and electrically connected to one another through metal contacts. The first package includes a first printed circuit board (PCB), a system on chip which is connected to the first PCB through bumps, and a first memory device which is connected to the system on chip through micro bumps connected to vias in the system on chip. The second package includes a second PCB, a second memory device connected to the second PCB, a third memory device connected to the second PCB, and a memory controller which is connected to the second PCB and controls the third memory device.

20 Claims, 40 Drawing Sheets

(56) References Cited

U.S. PATENT DOCUMENTS

| | | | |
|---|---|---|---|
| 8,901,750 B2 * | 12/2014 | Park | H01L 23/535 |
| | | | 257/686 |
| 9,087,701 B2 * | 7/2015 | Park | H01L 24/97 |
| 9,868,631 B2 * | 1/2018 | Frankel | B81B 7/008 |
| 2005/0185485 A1 | 8/2005 | Saitoh et al. | |
| 2007/0014140 A1 | 1/2007 | Telecco et al. | |
| 2009/0161402 A1 | 6/2009 | Oh et al. | |
| 2015/0228627 A1 | 8/2015 | Kwon et al. | |
| 2017/0109063 A1 * | 4/2017 | Lee | G06F 3/0611 |

* cited by examiner

SYSTEM ON PACKAGE (SOP) HAVING THROUGH SILICON VIA (TSV) INTERPOSER WITH MEMORY CONTROLLER CONNECTED TO MULTIPLE PRINTED CIRCUIT BOARDS (PCB)

PRIORITY STATEMENT

This application claims priority under 35 U.S.C. § 119(a) from Korean Patent Application No. 10-2015-0127222 filed on Sep. 8, 2015, the disclosure of which is hereby incorporated by reference in its entirety.

BACKGROUND

The present inventive concept relates to semiconductor device packages. More particularly, the inventive concept relates to a system on package (SoP) and to an electronic system including the same.

A system on chip (SoC) is a single chip (die) whose integrated circuit (IC), in general, performs all the functions of a particular application. A system-in-package (SiP), on the other hand, comprises dies containing integrated circuits that are stacked vertically and, in general, perform all of the functions of an electronic system. Although SoCs and SiPs may in some instances be considered alternatives, there is an example of a system-in-package (SiP) in which a dynamic random access memory (DRAM) chip is stacked on a system on chip (SoC). In this example of an SiP, the most common approach to electrically connecting the DRAM chip and the SoC is providing through-silicon-vias (TSVs) in the SoC, providing micro bumps in the DRAM chip, and connecting the TSVs and the micro bumps. The resulting device, which is cost-effective to manufacture in this way, may be referred to as an SoC-DRAM TSV-SiP.

However, if several DRAM chips are required due to a demand for a high memory capacity, the plurality of DRAM chips are stacked on each other and electrically connected using TSVs. In this case, the manufacturing cost of the SiP may become rather high to the point of being cost-prohibitive. In order to reign in the manufacturing costs, the manufacturer may provide the topmost DRAM chip with micro bumps instead of TSVs, i.e., may form TSVs only in the DRAM chip or chips electrically connected to the topmost DRAM chip. However, the manufacturer must develop and manufacture two types of DRAM chips to employ this technique. Thus additional development costs are incurred and it may be inefficient to manufacture and package two different types of DRAM chips.

SUMMARY

Example of a system on package (SoP) according to the present inventive concept include: a first package, a second package disposed on the first package so as to be stacked therewith, and electrical contacts interposed between and electrically connecting the first and second packages. The first package includes a first printed circuit board (PCB), a system on chip (SoC) having through-vias extending vertically therethrough, conductive bumps electrically connecting the SoC to the first PCB, and a first memory device having micro bumps electrically connected to the through-vias to thereby electrically connect the first memory device to the SoC. The second package includes a second PCB of the SoP, a second memory device of the SoP electrically connected to the second PCB, a third memory device of the SoP electrically connected to the second PCB, and a memory controller which is electrically connected to the second PCB and is operatively electrically connected to the third memory device to control the third memory device.

Examples of a system on package (SoP) according to the present inventive concept include: a first package including a first printed circuit board (PCB) of the SoP, a controller disposed on an upper surface of the first PCB, and a first memory chip of the SoP stacked on the controller, a second package stacked on the first package and including a second printed circuit board (PCB) of the SoP, and a stack of chips disposed on an upper surface of and electrically connected to the second PCB, and an array of electrical contacts interposed between the upper surface of the first PCB and a bottom surface of the second PCB and electrically connecting the first and second PCBs to one another. The memory chip of the first package is disposed on and connected to the controller with a flip chip connection such that an active surface of the memory chip of the first package faces in a direction towards the controller. The stack of chips of the second package includes a second memory chip of the SoP. Also, the controller is electrically connected to the first memory chip by the flip chip connection, electrically connects the first memory chip to the first PCB, is electrically connected to the stack of chips of the second package by the first PCB and the electrical contacts, and is configured to control operations of the first and second memory chips.

BRIEF DESCRIPTION OF THE DRAWINGS

These and/or other aspects and advantages of the present general inventive concept will become apparent and more readily appreciated from the following description of examples of the inventive concept, taken in conjunction with the accompanying drawings of which.

DETAILED DESCRIPTION

Figure 1:
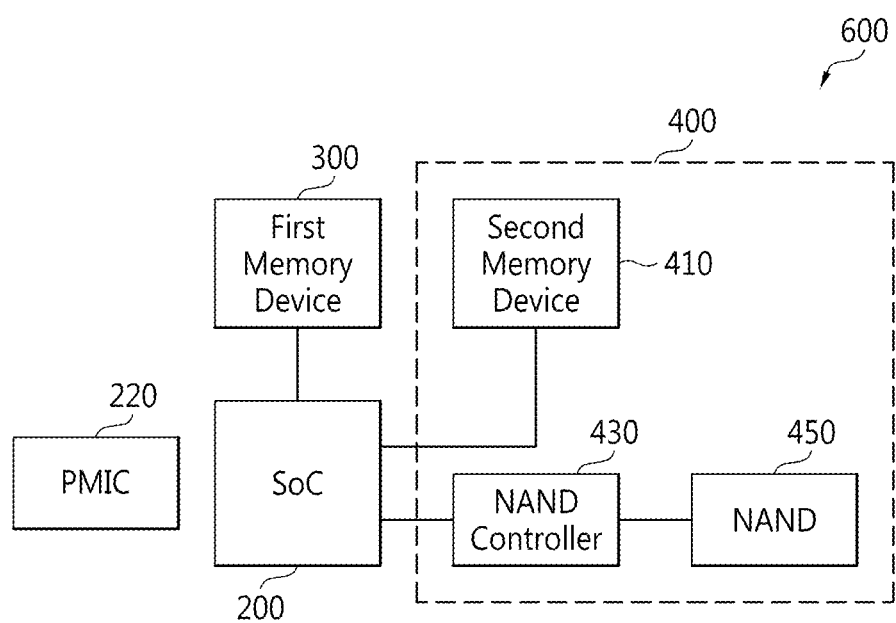
FIG. 1 is a functional block diagram of an electronic system according to examples of the present inventive concept.

Reference will now be made in detail to the examples of the present general inventive concept, examples of which are illustrated in the accompanying drawings, wherein like reference numerals denote like elements throughout. The examples are described below merely to allow for a thorough and complete understanding of the manners in which the present general inventive concept may be made and used.

The terminology used herein for the purpose of describing particular examples or embodiments of the inventive concept is to be taken in context. For example, the terms "comprises" or "comprising" when used in this specification specifies the presence of stated features but does not preclude the presence or additional features. The term "software" is used in its most basic form as descriptive of any of various types of programs.

FIG. 1 is a functional block diagram representative of an example of electronic systems according to the present inventive concept. Referring to FIG. 1, the electronic system 600 may include a controller 200, a first memory device 300, a second memory device 410, a memory controller 430, and a third memory device 450. The electronic system 600 may further include a power management IC (PMIC) 220 which supplies an operational voltage(s) to each component 200, 300, 410, 430, or 450. The level of operational voltage(s) supplied to each component 200, 300, 410, 430, or 450 may be designed to be the same as or different from each other.

The electronic system 600 may be that of, i.e., may constitute, a PC or a mobile device. The mobile device may be a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device, or a drone.

The controller 200 may control an operation of each of the first memory device 300, the second memory device 410, and the memory controller 430. For example, the controller 200 may be an integrated circuit (IC), a system on chip (SoC), a processor, an application processor (AP), a mobile AP, a chipset, or a set of chips. For example, the controller 200 may include a central processing unit (CPU), a graphics processing unit (GPU), and/or a modem. For example, the controller 200 may perform the function of a modem and the function of an AP. The memory controller 430 may control the third memory device 450 under the control of the controller 200.

Each of the memory devices 300, 410, and 450 may be a semiconductor chip or a die. Each of the memory devices 300 and 410 may be a volatile memory device. The volatile memory device may be a random access memory (RAM), a dynamic RAM (DRAM), or a static RAM (SRAM); however, it is not limited thereto.

The first memory device 300 may be a Wide I/O DRAM or LPDDR2 DRAM; however, it is not limited thereto. The second memory device 410 may be an LPDDR4 DRAM or an LPDDR5 DRAM; however, it is not limited thereto. The second memory device 410 may be used as a buffer or a buffer DRAM. The bandwidth of the first memory device 300 may be larger than the bandwidth of the second memory device 410.

The third memory device 450 may be a storage memory device or what may be referred to as a cache. The storage memory device may be a non-volatile memory device. The non-volatile memory device may include non-volatile memory cells. Each of the non-volatile memory cells may include an electrically erasable programmable read-only memory (EEPROM), a flash memory, a magnetic RAM, a spin-transfer torque MRAM, a ferroelectric RAM (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, or an insulator resistance change memory.

The storage memory device may be a flash-based memory device; however, it is not limited thereto. The third memory device 450 may be a NAND-type flash memory device. The NAND-type flash memory device may include a two-dimensional (2D) memory cell array or a three-dimensional (3D) memory cell array. The 2D memory cell array or the 3D memory cell array may include a plurality of memory cells, and each of the plurality of memory cells may store one bit of information or two-bits or more of information.

When the third memory device 450 is a flash-based memory device, the memory controller 430 may use or support a multimedia card (MMC) interface, an embedded MMC (eMMC) interface, or a universal flash storage (UFS) interface; however, it is not limited thereto.

The controller 200 and the first memory device 300 may both constitute a first semiconductor package, and the second memory device 410, the memory controller 430, and the third memory device 450 may together constitute a second semiconductor package 400. The system on package (SoP), for example, a package on package (PoP), may include the second package 400 disposed on (stacked directly on or above) the first package 300. The second memory device 410, the memory controller 430, and the third memory device 450 may together constitute a multi-chip package (MCP). Examples of an SoP as a type of PoP according to the present inventive concept will be described in detail referring to FIGS. 4 to 60.

Memories of an SoP according to the present inventive concept may be managed according to a tiering scheme or a heterogeneous memory allocation (HMAT) scheme. In the tiering scheme, the first memory device 300 may be used as a main memory device, and the second memory device 410 may be used as a reserve memory device. In the HMAT scheme, a bandwidth (or channel) of the first memory device 300 and a bandwidth (or channel) of the second memory device 410 may be configured to store respective aggregates of chunks of the same size.

The SoC 200 may allocate at least one of first software requiring a first processing speed and first data related to the first software to the first memory device 300, allocate at least one of second software requiring a second processing speed slower than the first processing speed and second data related to the second software to the second memory device 410, and allocate at least one of third software requiring a third processing speed slower than the second processing speed and third data related to the third software to the third memory device 450. The first bandwidth of the first memory device 300 may be larger than the second bandwidth of the second memory device 410. Here, the software may be an application or "app" or other type of program.

The SoC 200 may be configured to transfer software and/or data stored in the first memory device 300 to the second memory device 410 or the third memory device 450 when each of the first memory device 300 and the second memory device 410 does not have enough storage capacity. Moreover, the SoC 200 may be configured to transfer software stored in the second memory device 410 to the third memory device 450 when each of the first memory device 300 and the second memory device 410 does not have enough storage capacity.

The SoC 200 may be configured to transfer software and/or data transferred to the second memory device 410 or the third memory device 450 back to the first memory device 300 when each of the first memory device 300 and the second memory device 410 has enough storage capacity or room again. The SoC 200 may transfer software and/or data transferred to the third memory device 450 back to the second memory device 410 when the second memory device 410 has enough storage capacity or room again.

Figure 2:
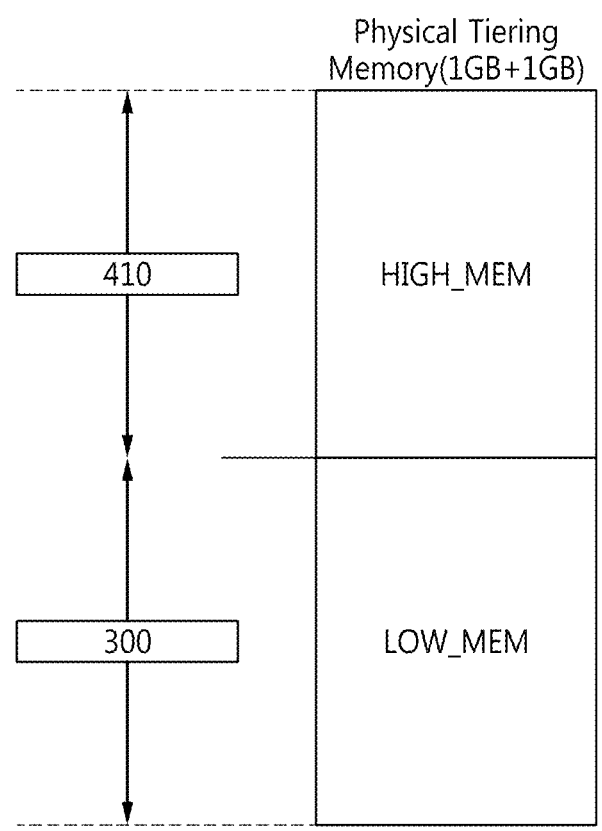
FIG. 2 is a map of memories which are of the electronic system shown in FIG. 1 and are configured by a tiering scheme according to examples of the present inventive concept.

FIG. 2 is a map of memory devices of the electronic system shown in FIG. 1 and are managed according to a tiering scheme according to examples of the present inventive concept.

Referring to FIGS. 1 and 2, the first memory device 300 is configured to have a high bandwidth Wide I/O, such that the first memory device 300 may be used as a low memory LOW-MEM which stores internal intellectual properties of an SoC, application software (or data) requiring a relatively fast processing speed or response time, and an operating system (OS).

The second memory device 410 may be used as a high memory HIGH_MEM which stores the internal IPs of an SoC and application software (or data) requiring a relatively slow processing speed or response time. For example, when a bandwidth of the first memory device 300 is 51.2 GB/s, a bandwidth of the second memory device 410 may be 25.6 GB/s; however, it is not limited thereto. Each of the bandwidth of the first memory device 300 and the bandwidth of the second memory device 410 may not differ.

Figure 3:
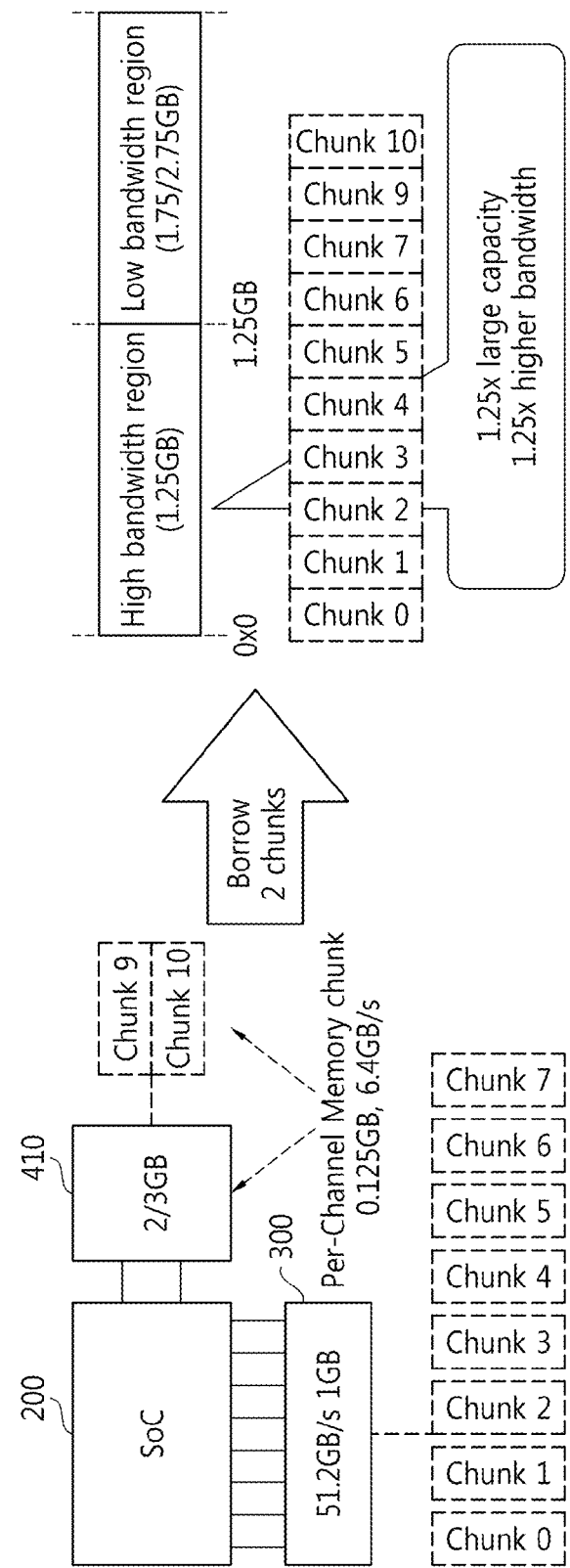
FIG. 3 is a map of memories which are of the electronic system shown in FIG. 1 and are configured by a heterogeneous memory allocation (HMAT) scheme according to examples of the present inventive concept.

FIG. 3 is a map of memory devices of the electronic system shown in FIG. 1 but managed by a heterogeneous memory allocation (HMAT) scheme according to examples of the present inventive concept. Referring to FIGS. 1 and 3, the channels of each of the first memory device 300 and the second memory device 410 may transmit fragments of information of the same size chunks, respectively. Accordingly, the density (or storage capacity) and the bandwidth of the electronic system can be increased at the same time as will be described in more detail below with reference to the right hand side of FIG. 3.

In an example in which the first memory device 300 is a Wide I/O DRAM, the density (or storage capacity) of the Wide I/O DRAM is 1.0 GB, the Wide I/O DRAM has eight channels, the bandwidth per channel is 6.4 GB/s, the second memory device 410 is an LPDDR4 DRAM, the density (or storage capacity) of the LPDDR4 DRAM is 2.0 GB (or 3.0 GB), the LPDDR4 DRAM has two channels, and the bandwidth per channel is 6.4 GB/s. Accordingly, the memory devices 300 and 410 constitute a 10-chunk HMAT.

When the first memory device 300 borrows two chunks Chunk9 and Chunk10 from the second memory device 410, the bandwidth of a high bandwidth region is increased from 51.2 GB/s (=6.4 GB/s*8) to 64 GB/s (=6.4 GB/s*8+6.4 GB/s*2), and the density is increased from 1 GB to 1.25 GB. When the density of the second memory device 410 is 2.0 GB and two chunks Chunk 9 and Chunk 10 are borrowed by the first memory device 300, the density of a low bandwidth region is changed from 2.0 GB to 1.75 GB. When the density of the second memory device 410 is 3.0 GB and two chunks Chunk 9 and Chunk 10 are borrowed by the first memory device 300, the density of a low bandwidth region is changed from 3.0 GB to 2.75 GB. The term borrowing a chunk(s) refers to an operation of one memory device in which the chunk(s) being "borrowed" is/are transmitted using a channel(s) of another device.

In another example of an electronic system having memory devices managed by an HMAT scheme according to the inventive concept, the Wide I/O DRAM (memory device 300) has four channels, the LPDDR4 DRAM (memory device 410) has two channels, and the bandwidth per channel is 12.8 GB/s. Thus, in this example, memory devices 300 and 410 constitute a five-chunk HMAT.

As is clear from the description above, in examples according to the inventive concept, the first memory device 300 may be configured to transmit or store a plurality of first chunks, the second memory device 410 may be configured to transmit or store at least one second chunk, and the system on chip 200 may increase the effective bandwidth and density of the first memory device 300, and decrease the effective bandwidth and density of the second memory device 410 using the first and second chunks.

Also, in these examples, the size (in units of GB, for example) of each of the plurality of first chunks is the same as that of each second chunk. Here, the term size may correspond to a measure of the bandwidth per channel, and may be termed as simply either the bandwidth or density of the chunk. Accordingly, the bandwidth of a high bandwidth region of the system may be increased from 51.2 GB/s to 64 GB/s and the density (or storage capacity) of the high bandwidth region may be increased from 1.0 GB to 1.5 GB. At the same time, the bandwidth of a low bandwidth region is 12.8 GB/s, and the density thereof may be decreased from 3.0 GB to 2.5 GB.

In an OS booting step or process, kernel running or executing in a central processing unit (CPU) of the SoC 200 may set the bandwidth (or establish a number of operating channels) of each memory device 300 and 410 so that the size of the chunks associated with the first memory device 300 is the same as the size of the chunk(s) associated with the second memory device 410. For example, the kernel may configure an HMAT of a density or storage capacity of a particular number of chunks.

Figure 4:
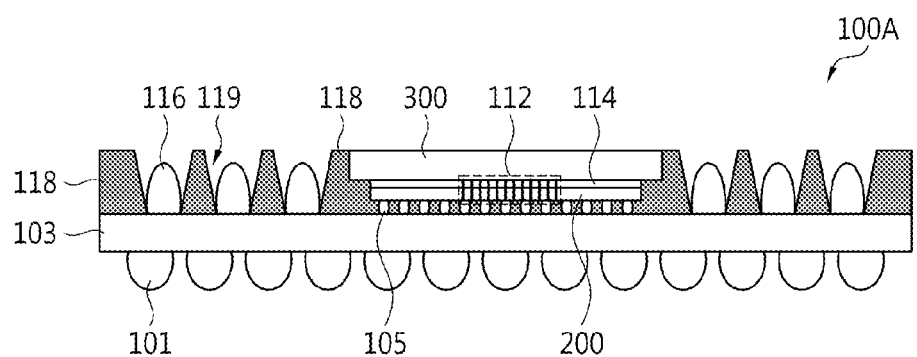
FIG. 4 is a cross-sectional view of an example of a first package according to the present inventive concept.

FIG. 4 is a cross-sectional view of an example of a first package according to the present inventive concept. Referring to FIG. 4, the first package 100A is a system-in-package (SiP) which does not include an interposer substrate. For example, the first package 100A may be an exposed molded underfill-laser drill process (eMUF-LDP)-SiP. The first package 100A comprises the SoC 200 and the first memory device 300. The SoC 200 may be electrically connected to a first PCB 103 through metal balls, e.g., bumps 105. The SoC 200 may be connected to the first PCB 103 in a flip-chip configuration. Metal balls, e.g., solder balls 101, may be formed on a bottom surface of the first PCB 103.

The first memory device 300 may be connected (or bonded) to the bottom surface of the SoC 200 in a flip-chip configuration. For example, the first memory device 300 may be connected (or bonded) to a bottom surface of the SoC 200 using an adhesive 114. The first memory device 300 does not have any vias, such as through silicon vias (TSVs). Rather, micro bumps are provided which can be connected to TSVs 112 of the SoC 200. The first memory device 300 may transmit or receive signals or data to or from the SoC 200 through the micro bumps connected to the TSVs 112 of the SoC 200. Electrical contacts 116, e.g., metal balls, may be electrically connected to the first PCB 103. The term electrical contacts, as used herein, includes solder balls, solder bumps, bumps, micro bumps, or copper pads; however, it is not limited thereto.

Referring to FIG. 4, protection material 118 (referred to as molding material) may be formed in an exposed molded underfill (eMUF) configuration. For example, the protection material 118 may be an epoxy molding compound (EMC) to protect each chip 200 and 300 from the external environment; however, it is not limited to EMC. Also, the eMUF configuration formed by the protection material 118 may expose a bottom surface of the first memory device 300 in a flip-chip configuration, and extend completely around the above-described parts/components 105, 114, 116, 200, and 300 of the SiP.

The contacts 116 surrounded (or molded) by the protection material 118 may be disposed in vias 119 as exposed. The vias 119 may be formed using a laser drill via technique in which openings, constituting the vias 119, are formed in a layer of the protection material using a laser.

Figure 5:
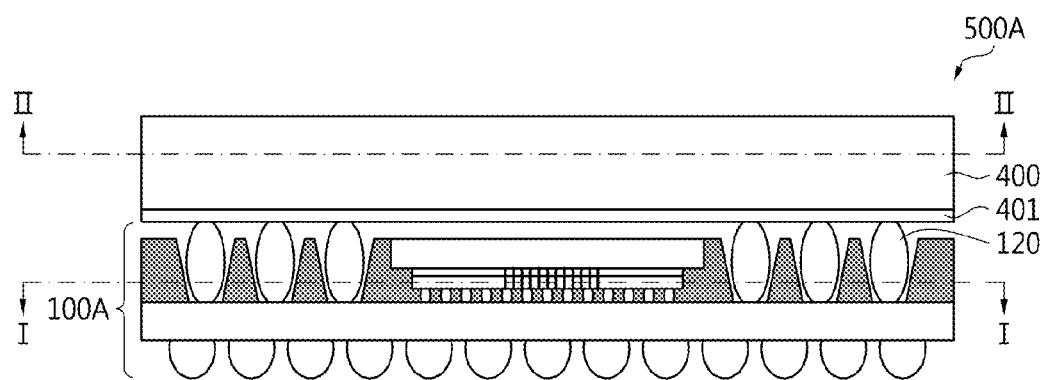
FIG. 5 is a cross-sectional view of a system on package (SOP) according to examples of the present inventive concept including a first package shown in FIG. 4.

FIG. 5 is a cross-sectional view of a system on package (SoP) according to examples of the present inventive concept including the first package shown in FIG. 4. Referring to FIGS. 4 and 5, a second package 400 which includes a second PCB 400, e.g., semiconductor substrate 401, may be electrically connected to the first PCB 103 through metal balls, e.g., stack connection solder balls 120 which may be formed by connecting contact balls to the semiconductor substrate 401.

The stack connection solder balls 120 are connected to the contacts 116, exposed by the vias 119, by an infrared (IR) reflow process. An empty space may be present between a surface of the protection material 118 and the semiconductor substrate 401. That is, the space between the first PCB 103 and the second PCB 401 may not be filled by the reflow process.

As a result, an SoP 500A including the first package 100A and the second package 400 stacked on the first package 100A through the stack connection solder balls 120 is formed. The SoP 500A of this example is an eMUF-LDP-SOP.

Figure 6:
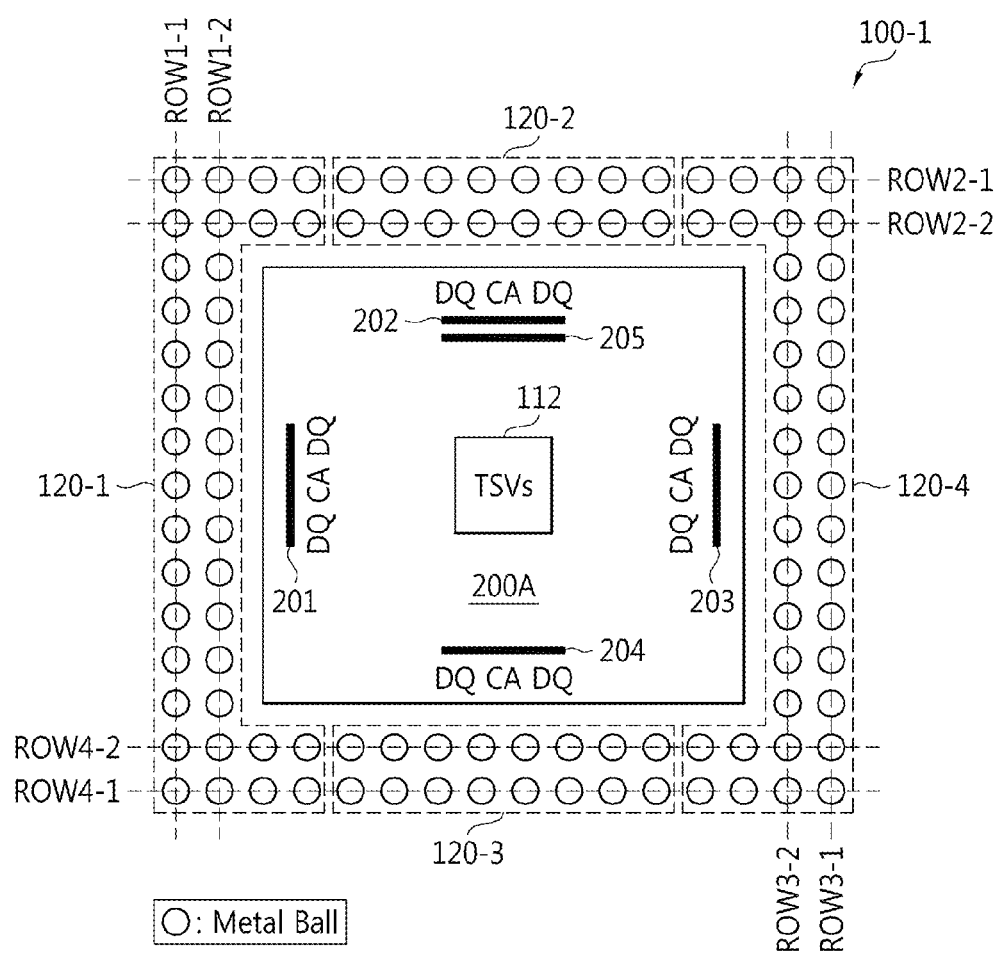
FIGS. 6 and 7 are plan views of a placement of physical layers and joint ball maps in a system on chip (SoC) according to examples of the present inventive concept, which are embodied in an SOP shown in FIG. 5 and are taken along direction of I-I.
Figure 7:
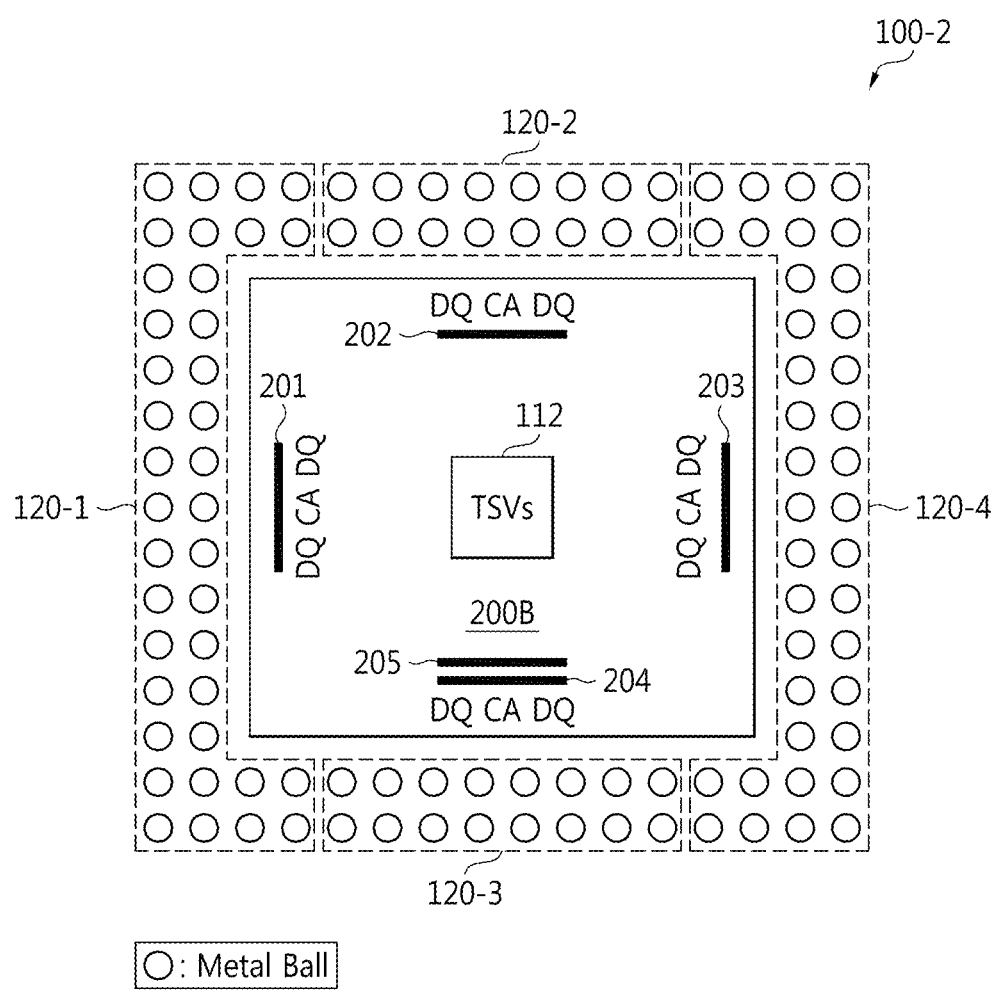

FIGS. 6 and 7 show examples of the layout of physical layers in a system on chip and a joint ball map of an SoP of the type shown in FIG. 5, according to the inventive concept, as each taken in the direction of line I-I of FIG. 5. In some embodiments, the physical layer means an input/output circuit including a plurality of input pins (or pads) and a plurality of output pins (or pads). In some embodiments, the physical layer consists of the basic networking hardware transmission technologies of a network. In some embodiments, the physical layer includes all circuitry for interface operation, including pins for transmitting signals, commands, or addresses, driver, and input buffers, parallel-to-serial and serial-to-parallel conversion, PLL(s), and impedance matching circuitry. The physical layer includes also logical functions related to interface initialization and maintenance.

Referring to FIGS. 5 and 6, reference numeral 120 collectively represents stack connection solder balls 120-1, 120-2, 120-3, and 120-4, and the stack connection solder balls 120 may be referred to hereinafter as "joint balls".

The SoC 200A shown in FIG. 6 is an example of the SoC 200 of FIG. 1 and includes physical layers 201, 202, 203, 204, and 205 for communication with the second memory device 410. TSVs 112 may be disposed at a center of the SoC 200A which includes four corners and four sides, the physical layers 201, 202, 203, and 204 may be disposed adjacent each of the four sides, respectively, and a physical layer 205 for communication with the memory controller 430 may be disposed adjacent one of the four sides.

Here, the physical layers 201, 202, 203, 204, and 205 may include an interface (for example, pads or pins) for transmitting or receiving a command, an address, and/or data. The physical layers 201, 202, 203, 204, and 205 may be channels. The SoC 200A may transmit or receive a command, an address, and/or data to or from the first memory device 300 through the TSVs 112.

DQ designates a physical layer for transmitting data, and CA designates a physical layer for transmitting commands and/or addresses. Referring to FIG. 6, each of the physical layers 201, 202, 203, and 204 which include DQ and CA may be disposed adjacent the four sides of the SoC 200A, respectively.

Physical layer 201 may be connected to stack connection solder balls 120-1 through the bumps 105 and the first PCB 103, physical layer 202 may be connected to stack connection solder balls 120-2 through the bumps 105 and the first PCB 103, physical layer 203 may be connected to stack connection solder balls 120-4 through the bumps 105 and the first PCB 103, and physical layer 204 may be connected to stack connection solder balls 120-3 through the bumps 105 and the first PCB 103. The physical layer 205 may be connected to the stack connection solder balls 120-2 through the first PCB 103. For example, the physical layer 205 may be a physical layer for an interface (e.g., eMMC interface or UFS interface) supported by the memory controller 430; however, it is not limited thereto.

A joint ball map 100-1 in FIG. 6 shows a 2/2/2/2 layout or configuration. The first "2" denotes the number of rows ROW1-1 and ROW1-2 of the stack connection solder balls 120-1, the second "2" denotes the number of rows ROW2-1 and ROW2-2 of the stack connection solder balls 120-2, the third "2" denotes the number of rows ROW3-1 and ROW3-2 of the stack connection solder balls 120-4, and the fourth "2" denotes the number of rows ROW4-1 and ROW4-2 of the stack connection solder balls 120-3. A plurality of metal balls may be disposed in each row. However, the inventive concept is not limited to the 2/2/2/2 configuration shown in FIG. 6 but rather various configurations of the joint balls may be implemented depending on various design specifications.

Referring to FIGS. 6 and 7, except for the disposition of the physical layer 205, the joint ball map 100-1 shown in FIG. 6 and a joint ball map 100-2 shown in FIG. 7 are similar. The physical layer 205 shown in FIG. 6 may be connected to the stack connection solder balls 120-2 through the bumps 105 and the first PCB 103; however, alternatively, the physical layer 205 shown in FIG. 7 may be connected to the stack connection solder balls 120-3 through the bumps 105 and the first PCB 103.

Figure 8:
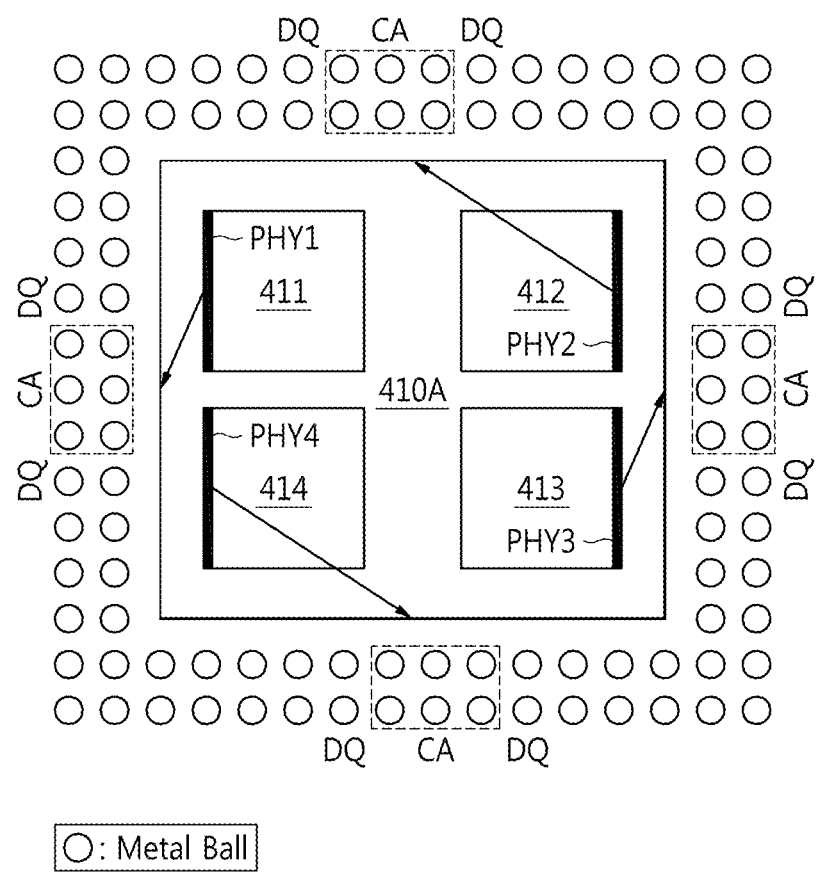
FIGS. 8 and 9 are plan views of a placement of physical layers in a second memory device and joint ball maps, which are shown in FIG. 5 and taken along direction of II-II.
Figure 9:
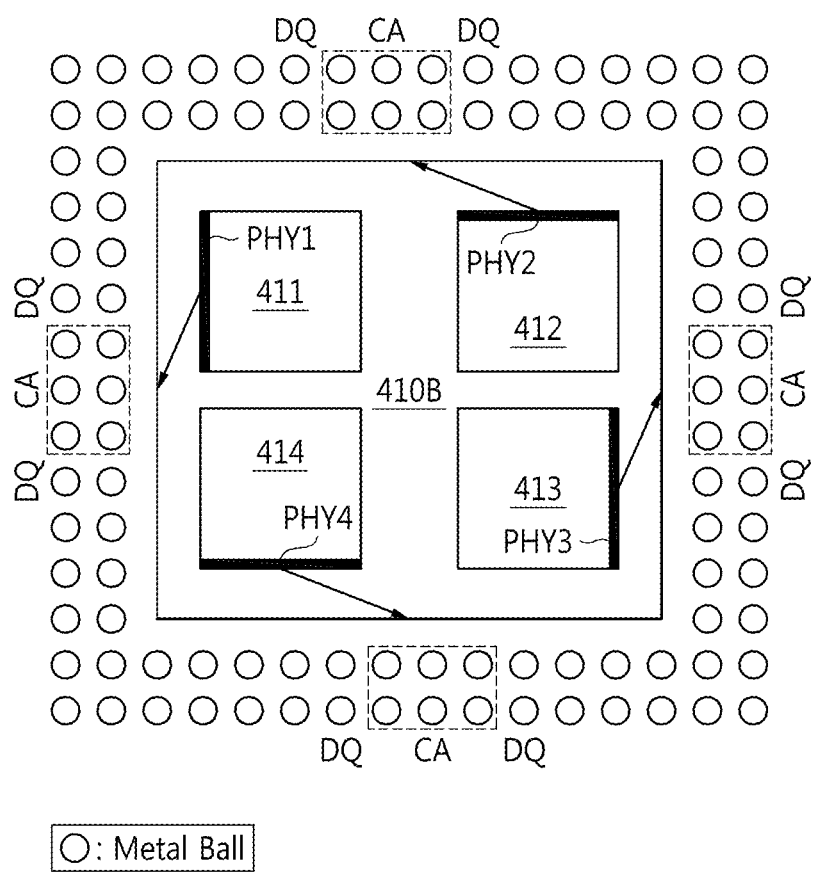

FIGS. 8 and 9 show examples of the layouts of physical layers in a second memory device and joint ball maps of an SiP of the type shown in FIG. 5, according to the inventive concept, and are each taken along direction of line II-II of FIG. 5.

Referring to FIG. 8, a second memory device 410A is an example of the second memory device 410 of a second semiconductor package 400 of FIG. 1 and may include each of data processing circuits 411, 412, 413, and 414 which include each of physical layers PHY1 to PHY4. Each of the data processing circuits 411, 412, 413, and 414 may be realized in the form of a semiconductor chip, a die, or a memory bank. Each of the physical layers PHY1 to PHY4 may include DQ and CA. Referring to FIG. 8, stack connection solder balls which can be connected to CA of each of the physical layers PHY1 to PHY4 may be disposed around a center of each side of the device 200A or 410A. The metal balls shown in FIG. 8 may be the metal balls 120.

Referring to FIGS. 8 and 9, except for the relative dispositions of the physical layers PHY1 to PHY4, the configuration of the second memory device 410A shown in FIG. 8 is similar to that of the second memory device 410B shown in FIG. 9.

FIGS. 10 to 17 show other examples of SoPs 500B, 500C, 500D, 500E and each of which have any of the layouts of elements/layers described with reference to FIGS. 6 to 9 according to the inventive concept.

Figure 10:
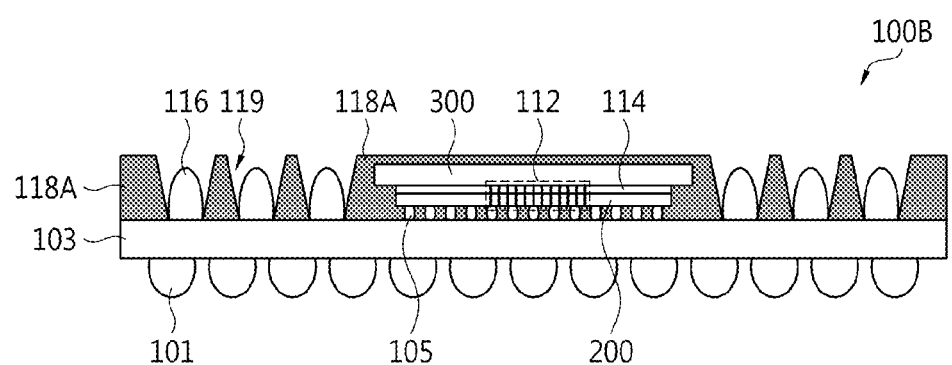
FIG. 10 is a cross-sectional view of a first package according to examples of the present inventive concept.
Figure 11:
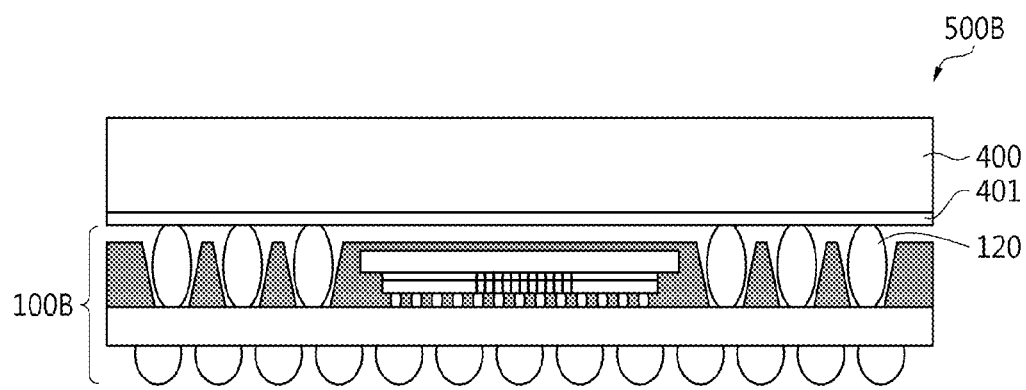
FIG. 11 is a cross-sectional view of an SOP according to examples of the present inventive concept which includes the first package shown in FIG. 10.

Referring to FIGS. 4, 10, and 11, a first package 100B of the SoP is similar to the first package 100A of the example of FIG. 4 except for the configuration of the protection or molding material 118A.

Briefly, the first package 100B does not include an interposer substrate, and the first package 100B may be SiP. The first package 100B may be a molded underfill-laser drill process (MUF-LDP)-SiP. The contact balls 116 may be connected to the first PCB 103. The contact balls 116 may be exposed in vias 119 formed using a laser drill via technique.

On the other hand, in this example, the protection material 118A has an MUF configuration. For example, the protection material 118A may be an EMC to protect each of the chips 200 and 300 from an external environment. More specifically, the protection material 118A may completely cover all of components 105, 114, 116, 200, and 300.

The second package 400 including the semiconductor substrate 401 may be connected to the first PCB 103 through the stack connection solder balls 120. The stack connection solder balls 120 may be formed by connecting the contact balls 116 and the contact balls connected to the semiconductor substrate 401, by an infrared (IR) reflow process. An empty space may be present between a surface of the protection material 118A and the semiconductor substrate 401. That is, an SOP 500B may include the first package 100B and the second package 400 stacked on or above the first package 100B through the stack connection solder balls 120. The first package 100B and the second package 400 constitute a package on package (PoP). The SoP 500B may be an MUF-LDP-SOP.

Figure 12:
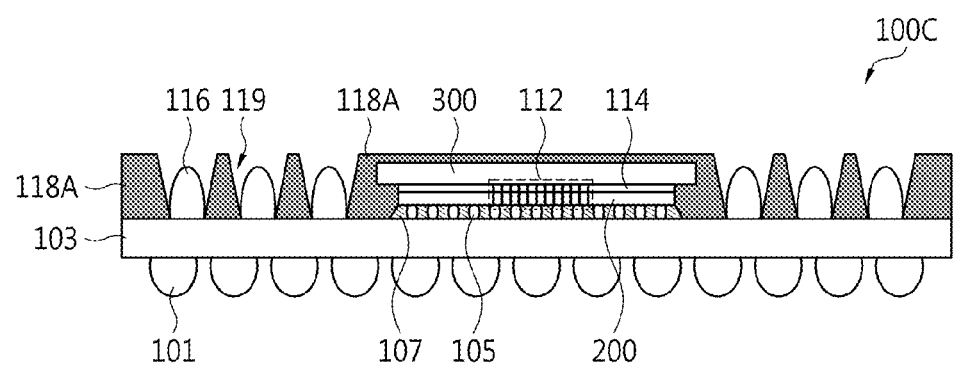
FIG. 12 is a cross-sectional view of a first package according to examples of the present inventive concept.
Figure 13:
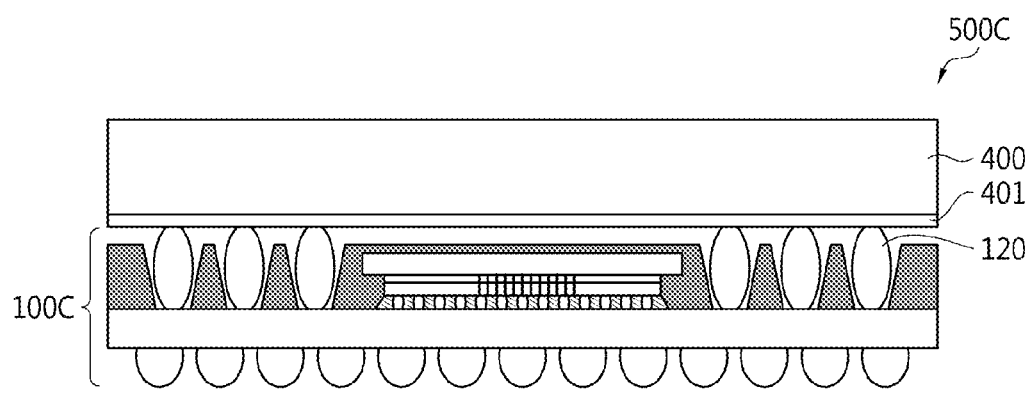
FIG. 13 is a cross-sectional view of an SOP according to examples of the present inventive concept which includes the first package shown in FIG. 12.

Referring to FIGS. 10, 12, and 13, except for a capillary underfill (CUF) material 107, the configuration or structure of the first package 100B of FIG. 10 is similar to that of package 100C of FIG. 12.

Briefly, the first package 100C does not include an interposer substrate, and the first package 100C may be SiP. The first package 100C may be a capillary (CUF)-mold-LDP-SiP.

The CUF material 107 may be interposed between the first PCB 103 and the SoC 200, in a portion of the SoC 200, and/or in a portion of the first memory device 300. The contact balls 116 may be connected to the first PCB 103. The protection material 118A may be formed in an MUF configuration. An empty space may be present between a surface of the protection material 118A and the semiconductor substrate 401. That is, the SOP 500C may include the first package 100B and the second package 400 stacked on or above the first package 100B through the stack connection solder balls 120. The SOP 500C may be a CUF-mold-LDP-SOP.

Figure 14:
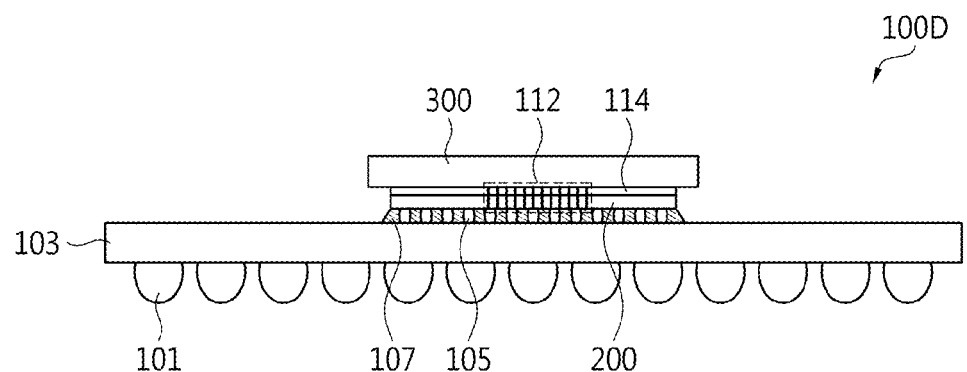
FIG. 14 is a cross-sectional view of a first package according to examples of the present inventive concept.

Referring to FIGS. 12 and 14, the first package 100D of the example of FIG. 14 is similar to the first package 100C of FIG. 12 except that the first package 100D does not include the protection material 118A.

Figure 15:
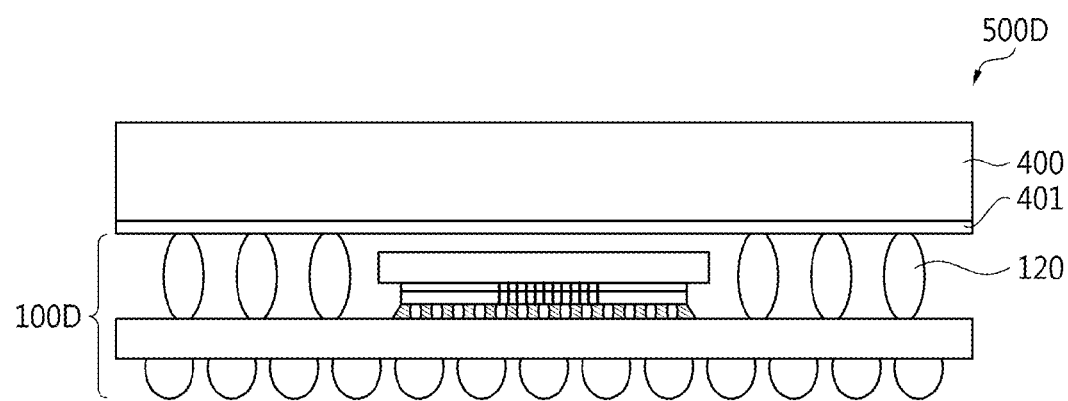
FIG. 15 is a cross-sectional view of an SOP according to examples of the present inventive concept which includes the first package shown in FIG. 14.

Referring to FIGS. 14 and 15, the first package 100D does not include an interposer substrate, and the first package 100D may be an SiP. The first package 100D may be a CUF-SiP.

The CUF material 107 may be interposed between the first PCB 103 and the SoC 200, in a portion of the SoC 200, and/or in a portion of the first memory device 300. Referring to FIG. 15, the second package 400 including the semiconductor substrate 401 may be connected to the first PCB 103 through the stack connection solder balls 120.

An empty space may be present between the bottom surface of the first memory device3 300 and the semiconductor substrate 401. That is, an SOP 500D may include the first package 100D and the second package 400 stacked on or above the first package 100D through the stack connection solder balls 120. The SOP 500D may be a CUF-SOP.

Figure 16:
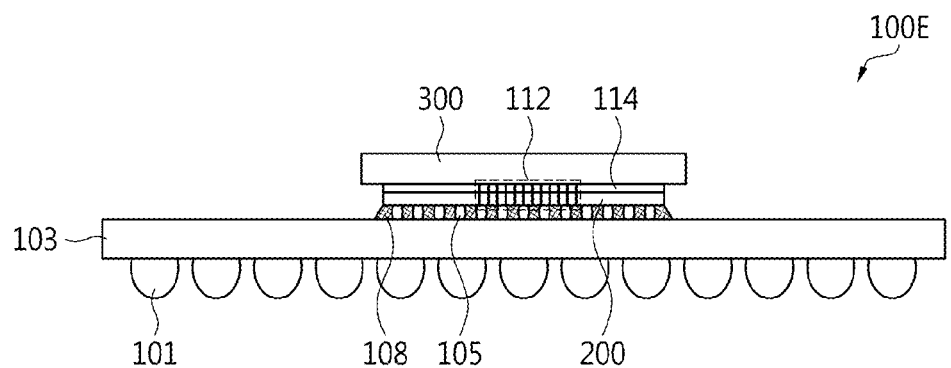
FIG. 16 is a cross-sectional view of a first package according to examples of the present inventive concept.

Referring to FIGS. 14 and 16, the first package 100E of the example of FIG. 16 is similar to that of the first package 100D except that a thermo compression non-conductive paste (TC NCP) or a thermo compression non-conductive film (TC NCF) is provided instead of the CUF material 107.

Figure 17:
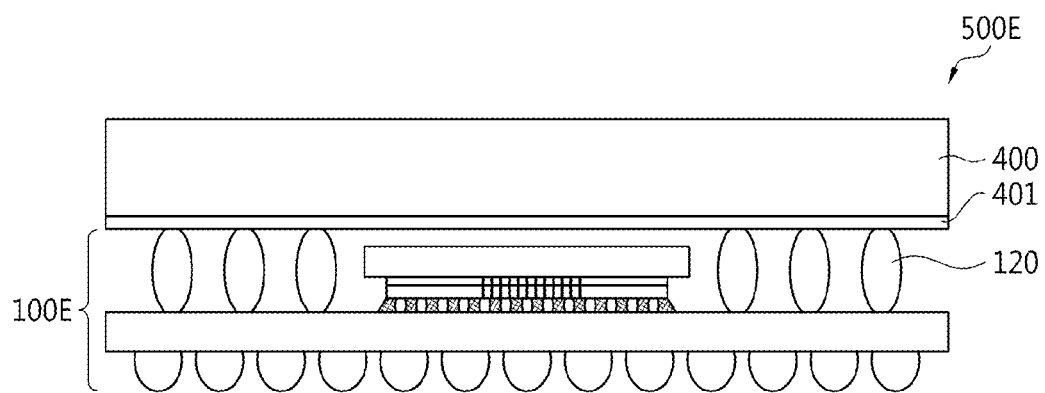
FIG. 17 is a cross-sectional view of an SOP according to examples of the present inventive concept which includes the first package shown in FIG. 16.

Referring to FIGS. 16 and 17, the first package 100E does not include an interposer substrate, and the first package 100E may be an SiP. The first package 100E may be a TC NCP/TC NCF-SiP.

A TC NCP/TC NCF 108 may be formed between the first PCB 103 and the SoC 200, in a portion of the SoC 200, and/or in a portion of the first memory device 300. Referring to FIG. 17, the second package 400 including the semiconductor substrate 401 may be connected to the first PCB 103 through the stack connection solder balls 120.

An empty space may be present between the bottom surface of the first memory device 300 and the semiconductor substrate 401. That is, the SoP 500E may include the first package 100E and the second package 400 stacked on or above the first package 100E through the stack connection solder balls 120. The SoP 500E may be a TC NCP/TC NCF-SOP.

Figure 18:
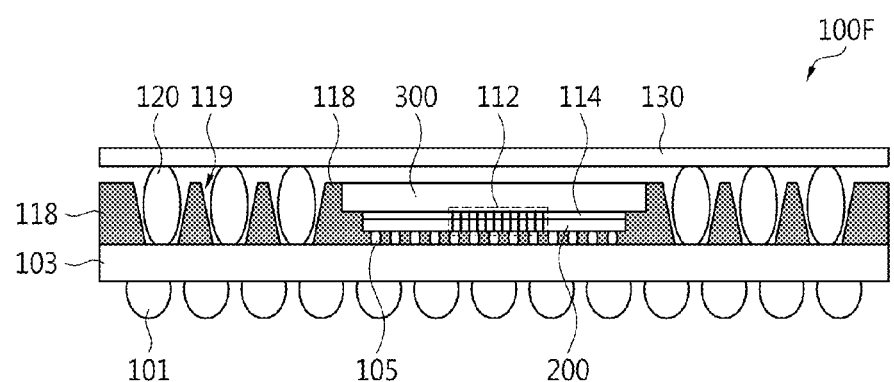
FIG. 18 is a cross-sectional view of a first package according to examples of the present inventive concept.
Figure 19:
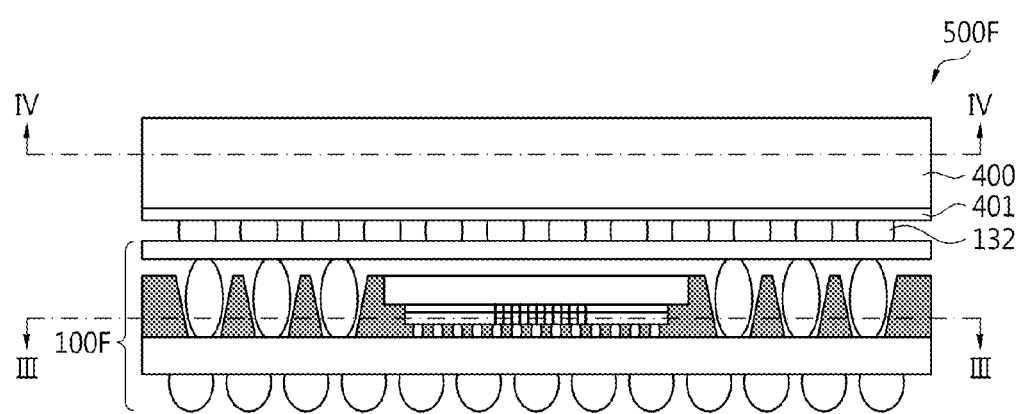
FIG. 19 is a cross-sectional view of an SOP according to examples of the present inventive concept which includes the first package shown in FIG. 18.

FIGS. 18 and FIG. 19 show other examples of an SoP according to the present inventive concept.

Referring to FIGS. 4 and 18, the first package 100F in the example of FIG. 18 is similar to the first package 100A of FIG. 4 except that an interposer substrate 130 is provided and the stack connection solder balls 120 are connected to the interposer substrate 130.

That is, the first package 100F includes the interposer substrate 130, and the first package 100F may be an SiP. The first package 100F may be an eMUF-LDP-interposer-SiP.

The interposer substrate 130 may be connected to the first PCB 103 through the stack connection solder balls 120. The second package 400 including the semiconductor substrate 401 may be connected to the interposer substrate 130 through metal balls, e.g., the stack connection solder balls 132. An empty space may be present between a surface of the protection material 118 and the interposer substrate 130, and between the bottom surface of the first memory device 300 and the interposer substrate 130. Only a portion of the space between the first package 100F and the interposer substrate 130 may be occupied by the protection material 118.

An SOP 500F may include the first package 100F, the interposer substrate 130 stacked on the first package 100F, and the second package 400 stacked on or above the interposer substrate 130. The SoP 500F may be an eMUF-LDP-interposer-SOP.

Figure 20:
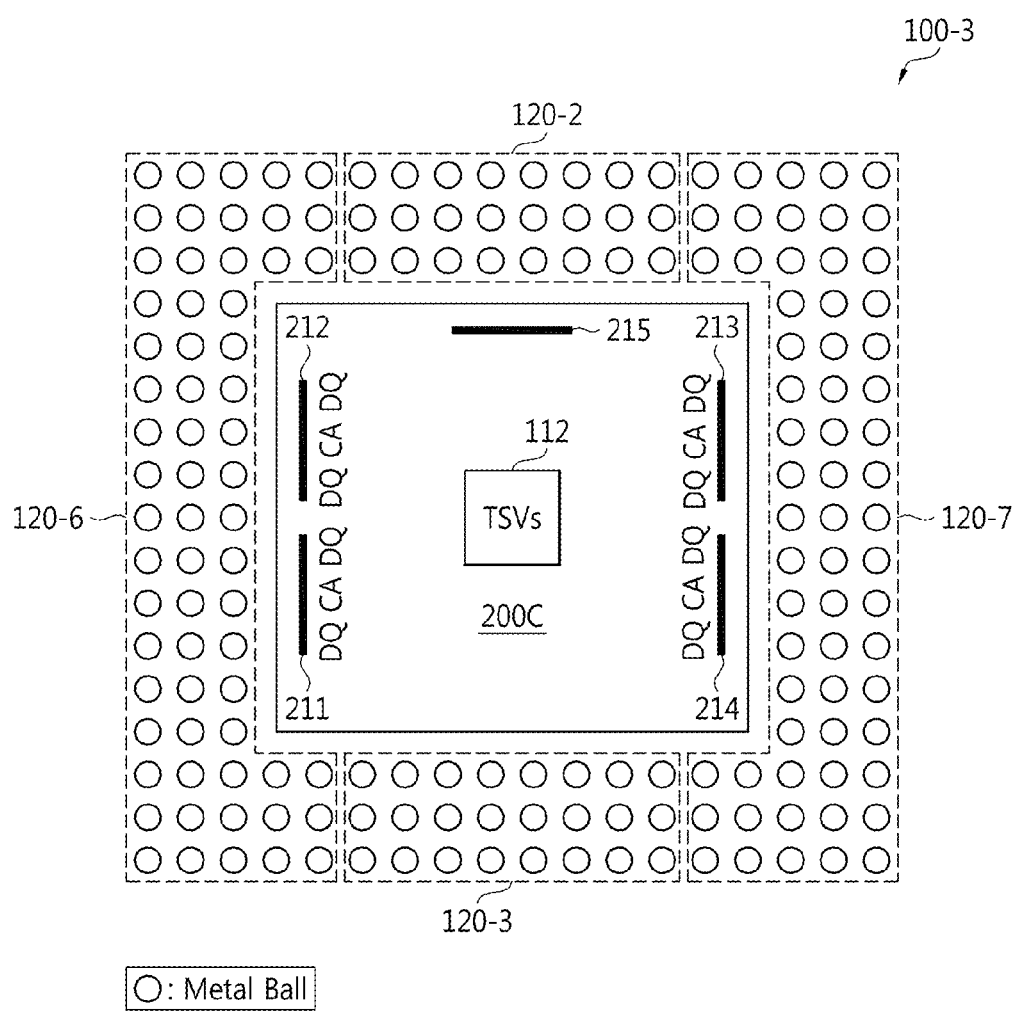
FIGS. 20 and 21 are plan views of a placement of physical layers in a system on chip and joint ball maps according to examples of the present inventive concept, which are embodied in an SOP shown in FIG. 19 and are taken along direction of III-III.
Figure 21:
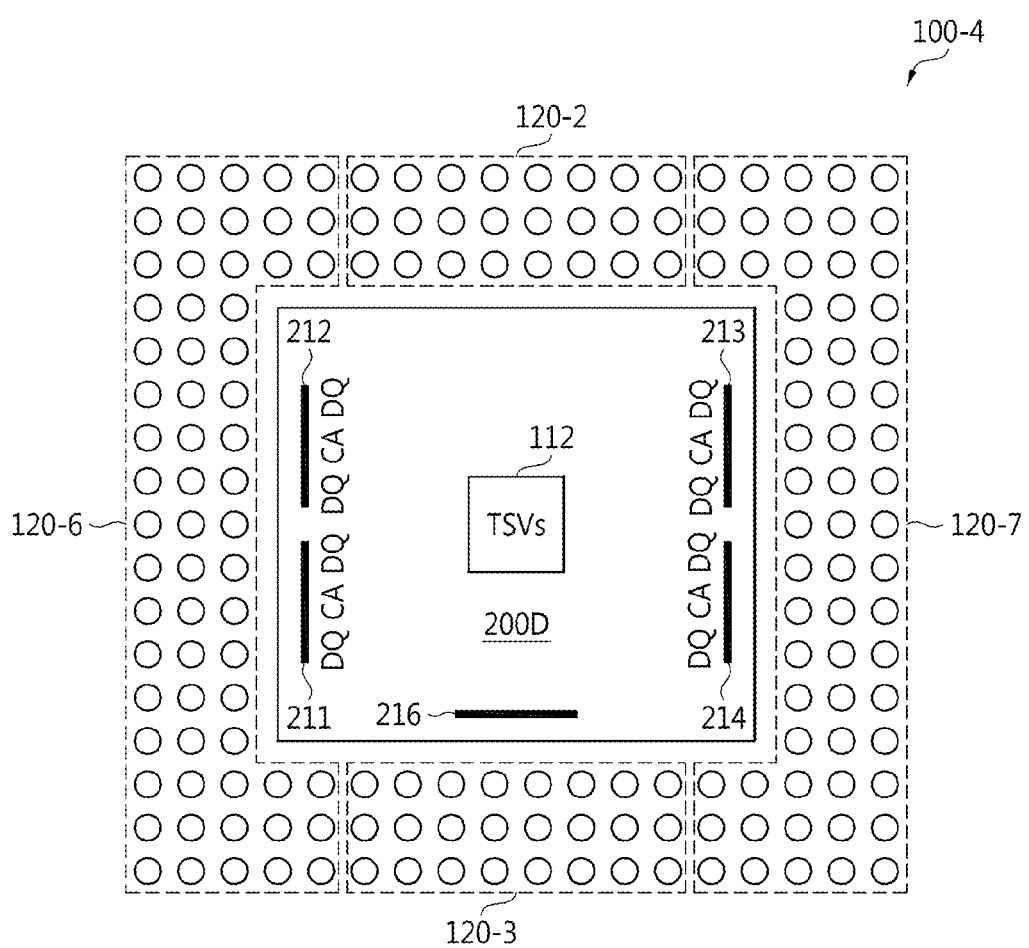

FIGS. 20 and 21 are plan views of examples of physical layers in a system on chip and joint ball maps, in an SOP of the type shown in FIG. 19, as viewed in the direction of line III-III in FIG. 19.

Referring to FIGS. 18 to 20, the stack connection solder balls 120 collectively represent stack connection solder balls 120-2, 210-3, 120-6, and 120-7, and may be referred to as joint balls.

The SoC 200C of FIG. 20 is an example of the SoC 200 of FIG. 1 and may include physical layers 211, 212, 213, 214, and 215. The TSVs 112 are disposed at a center of the SoC 200C, the physical layers 211, 212, 213, and 214 for communication with the second memory device 410 are disposed adjacent two of the sides of the SoC 200C that face each other, and a physical layer 215 for communication with the memory controller 430 is disposed adjacent one of the other sides of the SoC 200C.

The SoC 200C may transmit or receive an instruction, an address, and/or data to or from the first memory device 300 through the TSVs 112.

Physical layers 211 and 212 may be connected to stack connection solder balls 120-6 through the bumps 105 and the first PCB 103, physical layers 213 and 214 may be connected to stack connection solder balls 120-7 through the bumps 105 and the first PCB 103, and a physical layer 215 may be connected to stack connection solder balls 120-2 through the bumps 105 and the first PCB 103. The stack connection solder balls 120-3 may be used as dummy stack connection solder balls; however, they are not limited thereto. For example, the physical layer 215 may be a physical layer providing an eMMC interface or a UFS interface; however, it is not limited thereto.

A joint ball map 100-3 shown in FIG. 20 has a 3/3/3/3 configuration. The first "3" means the number of rows disposed on a left side of the SoC 200C, the second "3" means the number of rows disposed above the SoC 200C, the third "3" means the number of rows disposed on a right side of the SoC 200C, and the fourth "3" means the number of rows disposed at a bottom of the SoC 200C. According to examples, the joint ball map 100-3 shown in FIG. 20 may be embodied in a 4/2/4/2 configuration; however, a configuration of a joint ball map according to a technical concept of the present inventive concept is not limited to a 3/3/3/3 configuration or a 4/2/4/2 configuration. Stack connection solder balls connected to CA may be disposed at a corner of the SoC 200C.

Referring to FIGS. 20 and 21, except for a disposition of the physical layer 216, a joint ball map 100-4 of the example of FIG. 21 is similar to the joint ball map 100-3 of the example of FIG. 20. The physical layer 216 may be connected to the stack connection solder balls 120-3 through the bumps 105 and the first PCB 103. The stack connection solder balls 120-2 may be used as dummy stack connection solder balls; however, it is not limited thereto. For example, the physical layer 216 may be a physical layer providing an eMMC interface or a UFS interface; however, it is not limited thereto.

Figure 22:
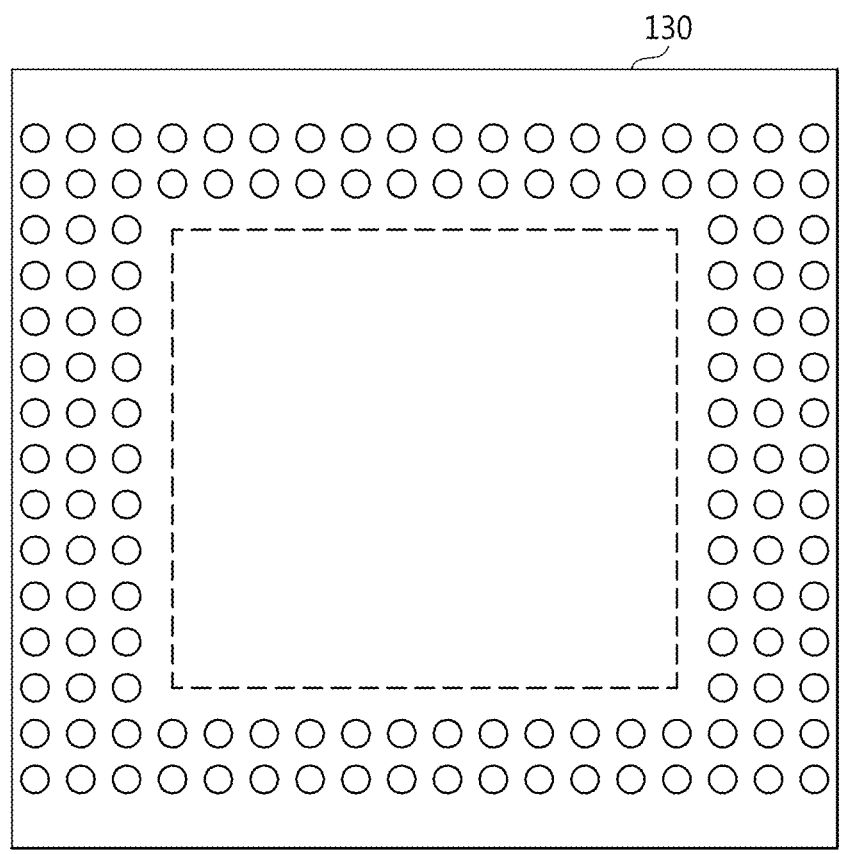
FIG. 22 us a plan view of a ball map of an interposer substrate shown in FIG. 19.

FIG. 22 is a plan view of a ball map of the interposer substrate shown in FIG. 19. Referring to FIGS. 19 and 22, a ball map of the interposer substrate 130 may have a 3/2/3/2 configuration; however, it is not limited thereto. For example, a pitch between metal balls shown in each of the joint ball maps 100-3 and 100-4 may be larger than a pitch between metal balls in the ball map of the interposer substrate 130.

Figure 23:
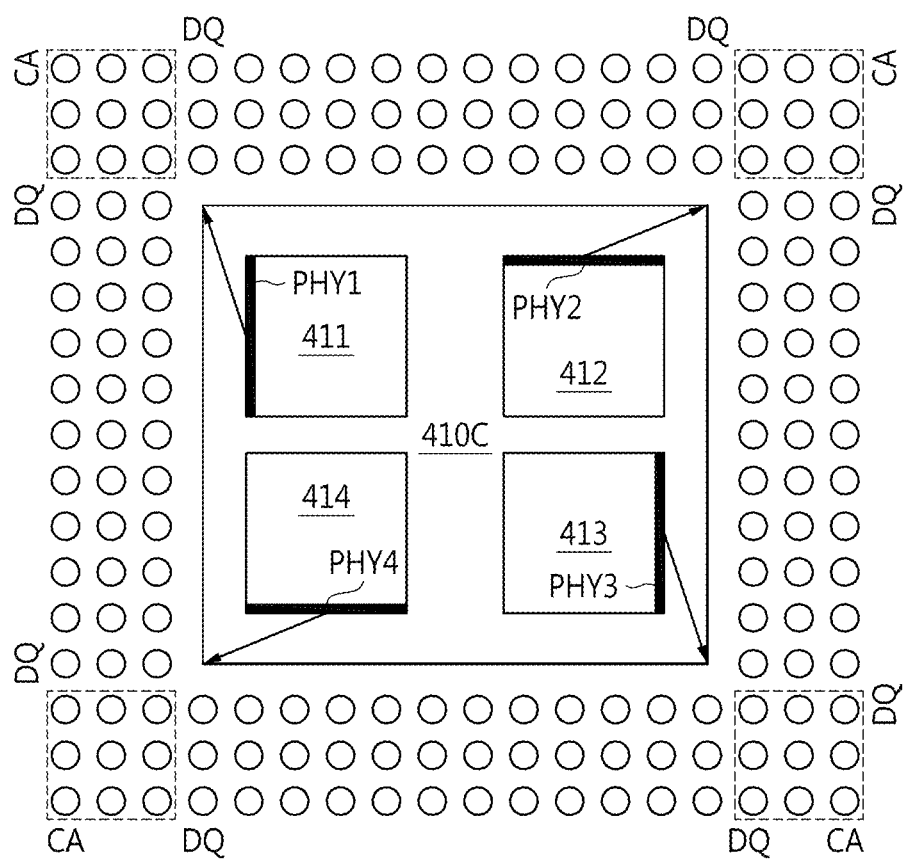
FIGS. 23 and 24 are plan views of a placement of physical layers in a second memory device and joint ball maps, which are shown in FIG. 19 and taken along direction of IV-IV.
Figure 24:
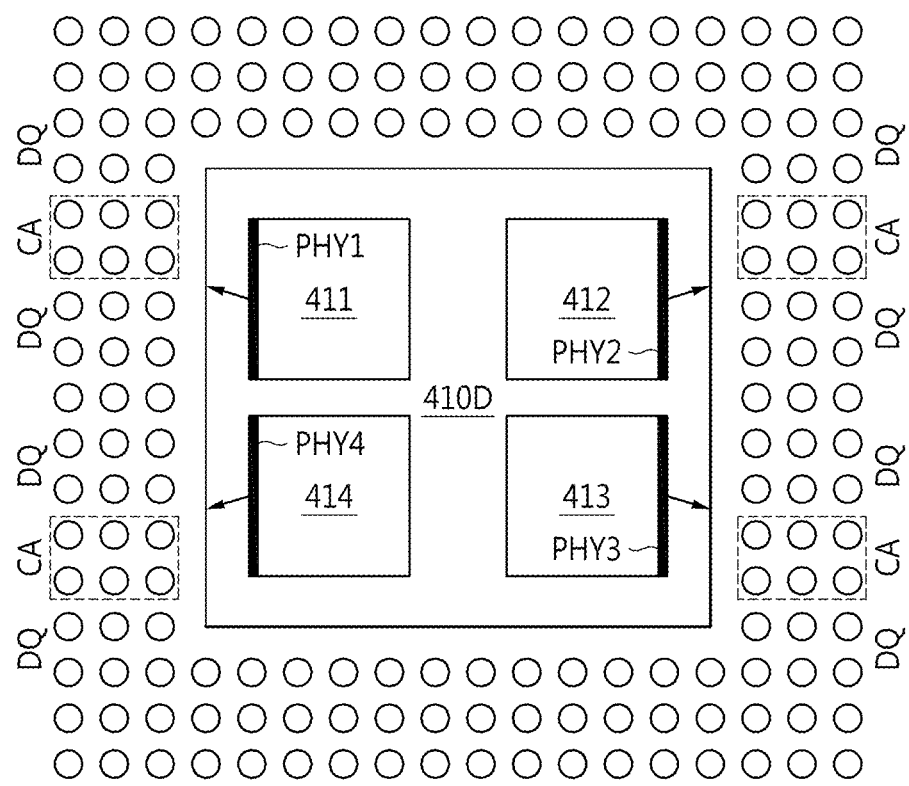

FIGS. 23 and 24 are plan views of examples of physical layers in a second memory device and joint ball maps, of the example shown in FIG. 19, as viewed in the direction of line IV-IV.

Referring to FIGS. 19 and 23, a second memory device 410C is an example of the second memory device 410 of FIG. 1, and may include each of the data processing circuits 411, 412, 413, and 414 which include each of physical layers PHY1 to PHY4. Each of the physical layers PHY1 to PHY4 may include DQ and CA, and first stack connection solder balls which can be connected to CA of each of the physical layers PHY1 to PHY4 may be disposed at a corner of the device 200 or 410C. Second stack connection solder balls which can be connected to DQ of each of the physical layers PHY1 to PHY4 may be disposed around the first stack connection solder balls.

Referring to FIG. 24, a second memory device 410D is an example of the second memory device 410 of FIG. 1. Except for the dispositions of each of the physical layers PHY1 to PHY4 and of first stack connection solder balls which can be connected to CA of each of the physical layers PHY1 to PHY4, the second memory device 410C is similar to the second memory device 410D.

Each configuration described with reference to FIGS. 20 to 24 may include the interposer substrate 130, and may be applied to each SoP described in the present specification.

Figure 25:
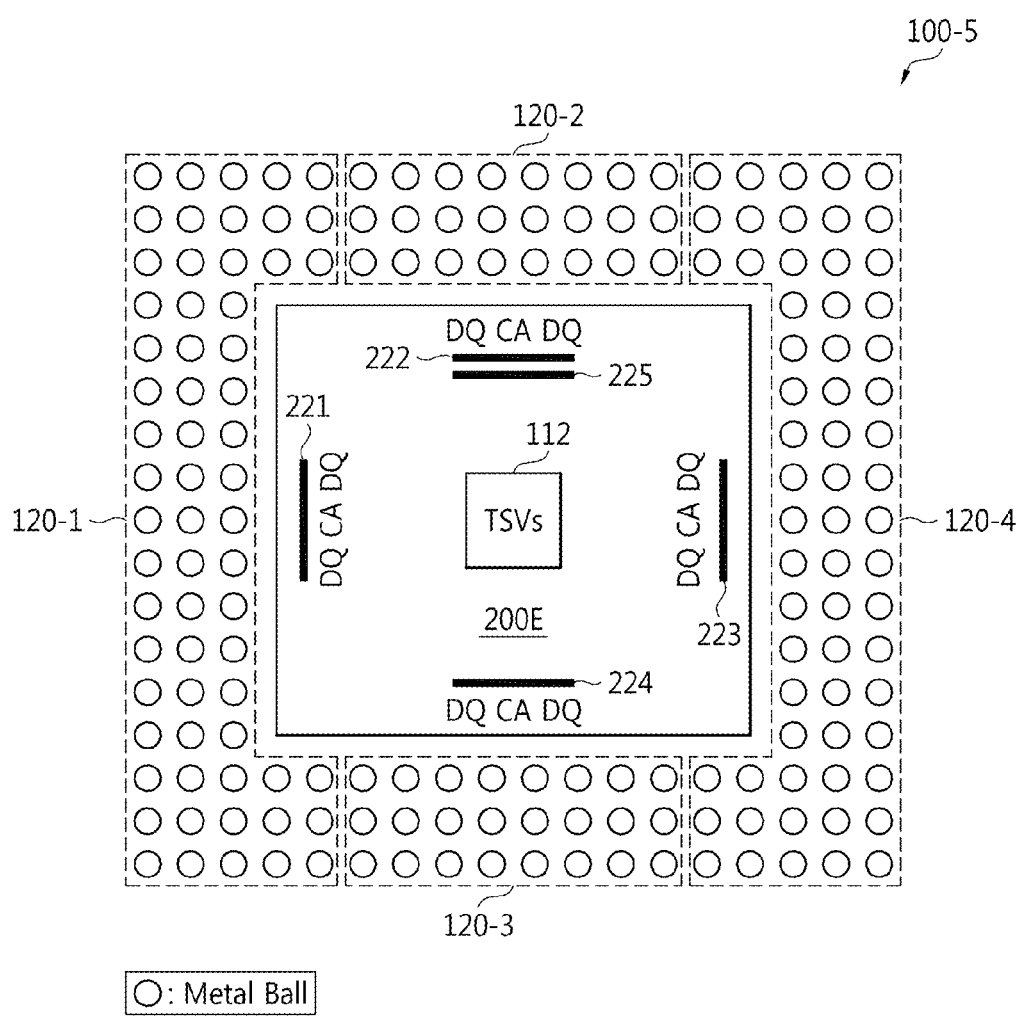
FIGS. 25 and 26 are plan views of a placement of physical layers in a system on chip and joint ball maps according to examples of the present inventive concept, which are embodied in the SOP shown in FIG. 19 and are taken along direction of III-III.
Figure 26:
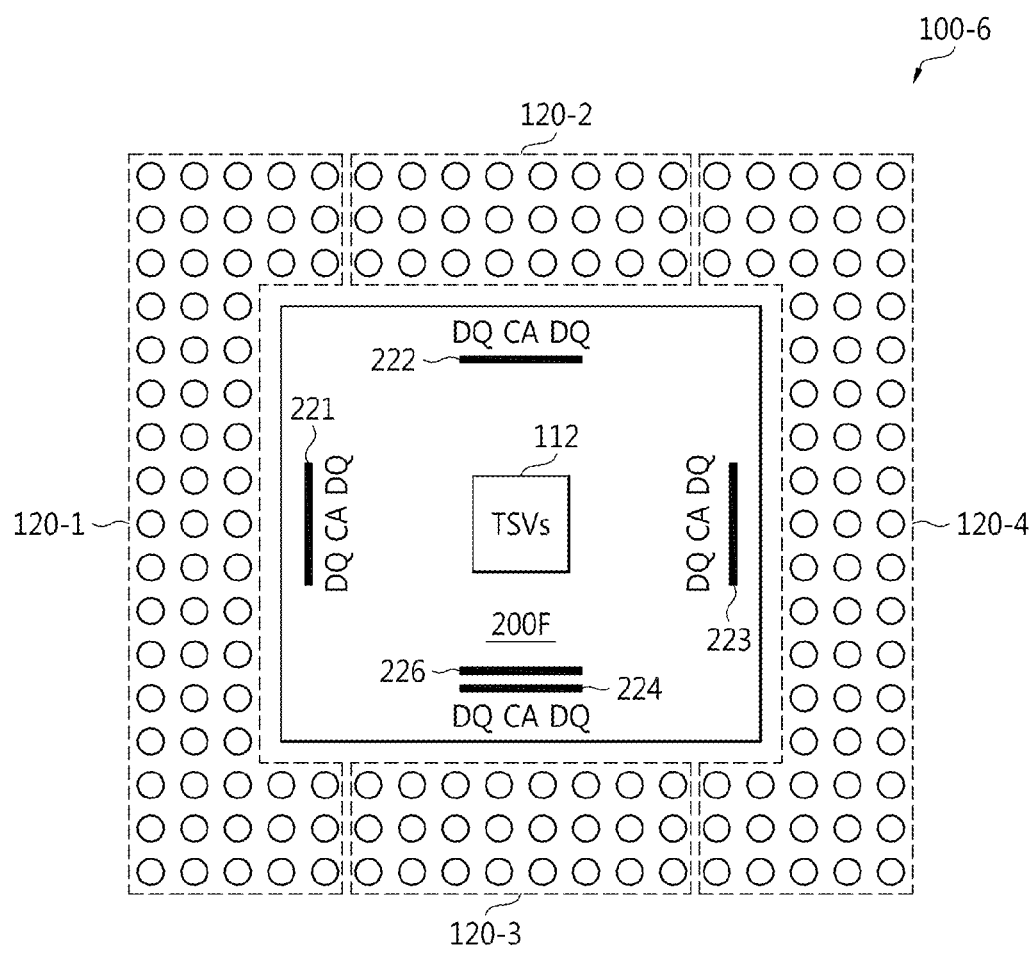

FIGS. 25 and 26 are plan views of still other examples of physical layers in a system on chip and joint ball maps according the present inventive concept, of an SoP of the type shown in FIG. 19, as viewed in the direction of line III-III.

Referring to FIGS. 18, 25 and 26, the stack connection solder balls 120 collectively represent the stack connection solder balls 120-1, 120-2, 120-3, and 120-4, and may be referred to as joint balls.

An SoC 200E of FIG. 25 is an example of the SoC 200 of FIG. 1, and may include physical layers 221, 222, 223, 224, and 225. The TSVs 112 may be disposed at a center of the SoC 200E, the physical layers 221, 222, 223, and 224 for communication with the second memory device 410 may be disposed adjacent each of four sides of the SoC 200E, and physical layer 225 for communication with the memory controller 430 may be disposed adjacent one of the four sides.

The SoC 200E may transmit or receive an instruction, an address, and/or data to or from the first memory device 300 through the TSVs 112.

The physical layer 221 may be connected to stack connection solder balls 120-1 through the bumps 105 and the first PCB 103, the physical layer 222 may be connected to stack connection solder balls 120-2 through the bumps 105 and the first PCB 103, the physical layer 223 may be connected to stack connection solder balls 120-4 through the bumps 105 and the first PCB 103, the physical layer 224 may be connected to stack connection solder balls 120-3 through the bumps 105 and the first PCB 103, and the physical layer 225 may be connected to stack connection solder balls 120-2 through the bumps 105 and the first PCB 103. The stack connection solder balls 120-3 may be used as dummy stack connection solder balls; however, it is not limited thereto. For example, the physical layer 225 may be a physical layer providing an eMMC interface or a UFS interface; however, it is not limited thereto.

A joint ball map 100-5 shown in FIG. 25 has a 3/3/3/3 configuration. The stack connection solder balls connected to CA may be disposed adjacent a center of each side of the SoC 200E.

Referring to FIGS. 25 and 26, except for the disposition of a physical layer 226, the joint ball map 100-6 shown in FIG. 26 is similar to the joint ball map 100-5 shown in FIG. 25. The physical layer 226 may be connected to the stack connection solder balls 120-3 through the bumps 105 and the first PCB 103. The stack connection solder balls 120-2 may be used as dummy stack connection solder balls; however, it is not limited thereto. For example, the physical layer 226 may be a physical layer providing an eMMC interface or a UFS interface; however, it is not limited thereto.

Figure 27:
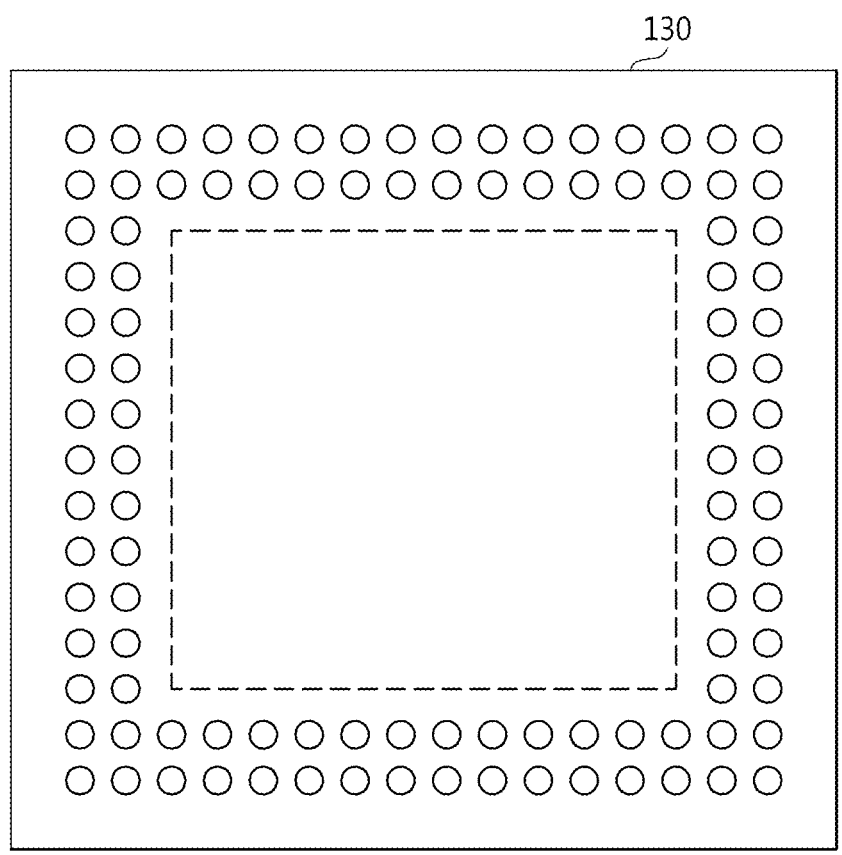
FIG. 27 is a plan view of a ball map of an interposer substrate shown in FIG. 19.

FIG. 27 is a plan view of a ball map of an interposer substrate of an example of an SoP of the type shown in FIG.

19. Referring to FIGS. 19 and 27, a ball map of the interposer substrate 130 may have a 2/2/2/2 configuration; however, it is not limited thereto. For example, a pitch between metal balls shown in each of the joint ball maps 100-5 and 100-6 may be larger than a pitch between metal balls shown in a ball map of the interposer substrate 130.

Figure 28:
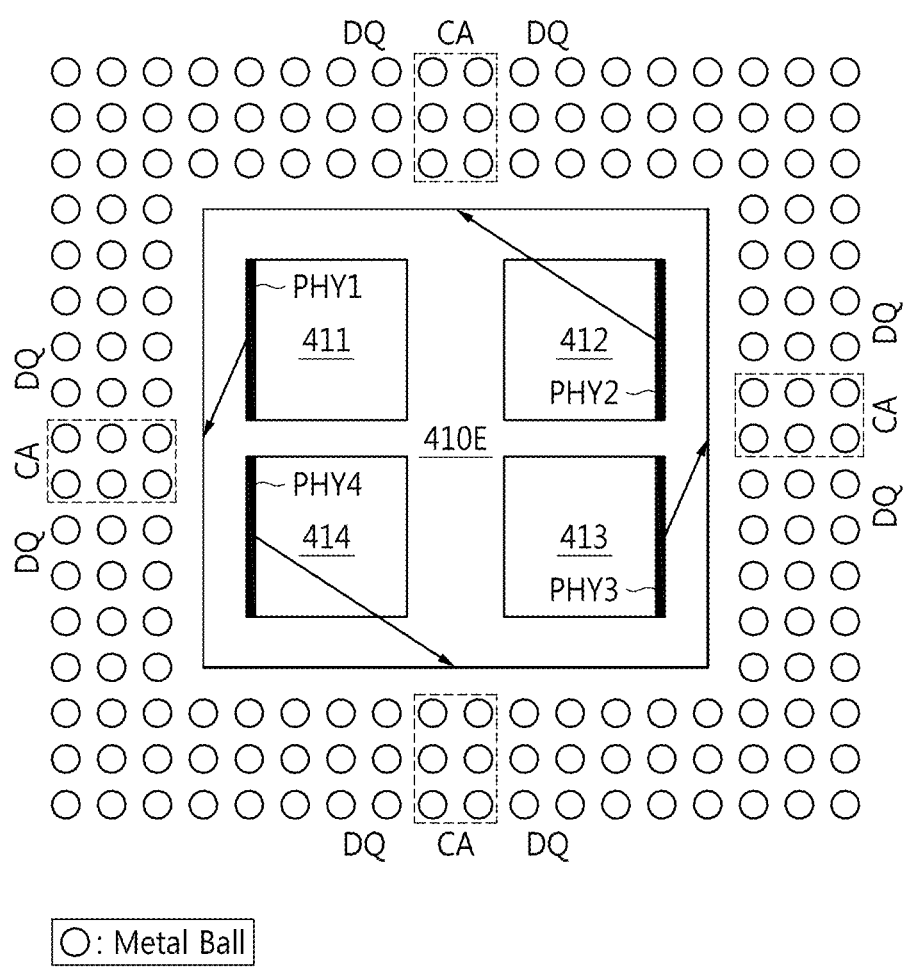
FIGS. 28 and 29 are plan views of a placement of physical layers in the second memory device and joint ball maps, which are shown in FIG. 19 and taken along direction of IV-IV.
Figure 29:
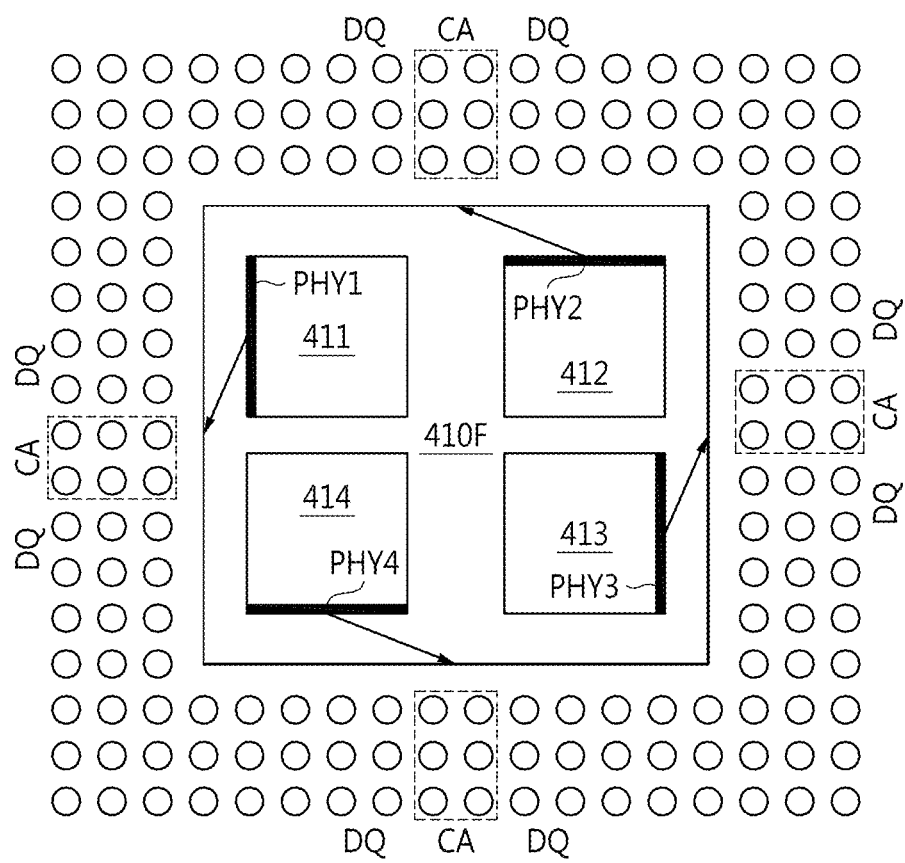

FIGS. 28 and 29 are plan views of a placement of physical layers in the second memory device and joint ball maps, which are shown in FIG. 19 and taken along direction of IV-IV.

Referring to FIGS. 19 and 28, a second memory device 410E is an example of the second memory device 410 of FIG. 1, and may include each of the data processing circuits 411, 412, 413, and 414 including each of the physical layers PHY1 to PHY4. Each of the physical layers PHY1 to PHY4 may include DQ and CA, and first stack connection solder balls which can be connected to CA of each of the physical layers PHY1 to PHY4 may be disposed adjacent a center of each side of the device 200 or 410E. Second stack connection solder balls which can be connected to DQ of each of the physical layers PHY1 to PHY4 may be disposed adjacent the first stack connection solder balls.

Referring to FIG. 29, a second memory device 410F is an example of the second memory 410 of FIG. 1. Except for the dispositions of each of the physical layers PHY1 to PHY4, the second memory device 410E is similar to the second memory device 410F.

The configurations including the interposer substrate 130 described with reference to FIGS. 25 to 29 may be applied to each SoP described in the present specification.

Figure 30:
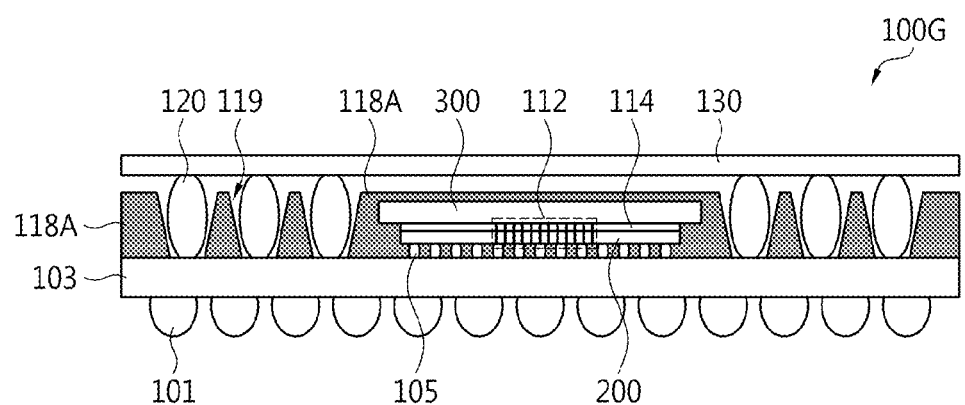
FIG. 30 is a cross-sectional view of a first package according to examples of the present inventive concept.
Figure 31:
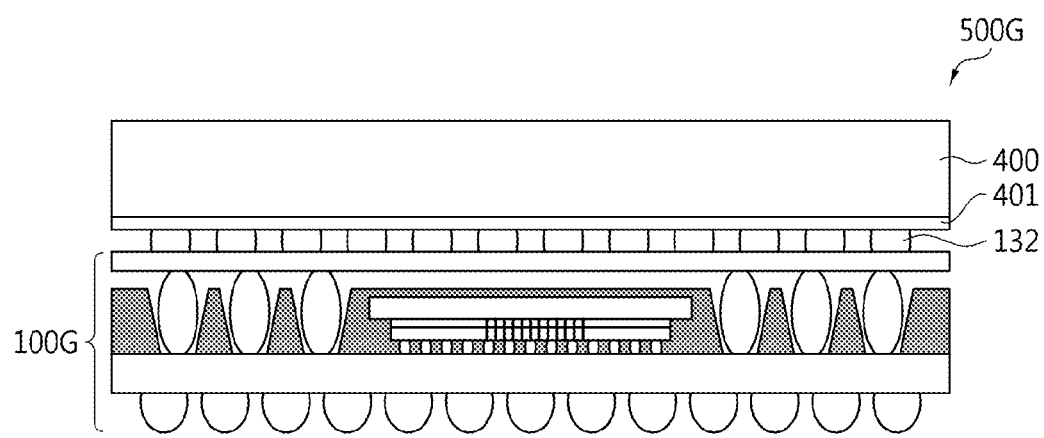
FIG. 31 is a cross-sectional view of an SOP according to examples of the present inventive concept which includes a first package shown in FIG. 30.

FIG. 30 is a cross-sectional view of a first package of still another example of the present inventive concept, and FIG. 31 is a cross-sectional view of an SoP which includes the first package shown in FIG. 30.

Referring to FIGS. 10 and 30, the first package 100G of FIG. 30 is similar to the first package 100B shown in FIG. 10 except that the interposer substrate 130 is present and the stack connection solder balls 120 are connected to the interposer substrate 130. That is, the first package 100G includes the interposer substrate 130 and the first package 100G may be an SiP. The first package 100G may be an MUF-LDP-interposer-SiP.

The interposer substrate 130 may be connected to the first PCB 103 through the stack connection solder balls 120. The second package 400 including the semiconductor substrate 401 may be connected to the interposer substrate 130 through metal balls, e.g., the stack connection solder balls 132. An empty space may be present between a surface of the protection material 118A and the interposer substrate 130. Each joint ball map described referring to FIGS. 20 to 29 may be applied to an SoP 500G including the interposer substrate 130. The SoP 500G may include the first package 100G, the interposer substrate 130 stacked on the first package 100G, and the second package 400 stacked on the interposer substrate 130. The SoP 500G may be an MUF-LDP-interposer-SOP.

Figure 32:
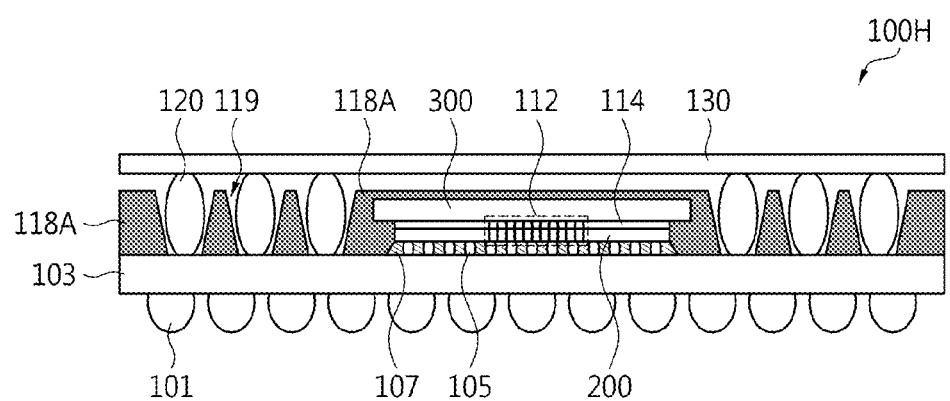
FIG. 32 is a cross-sectional view of a first package according to examples of the present inventive concept.
Figure 33:
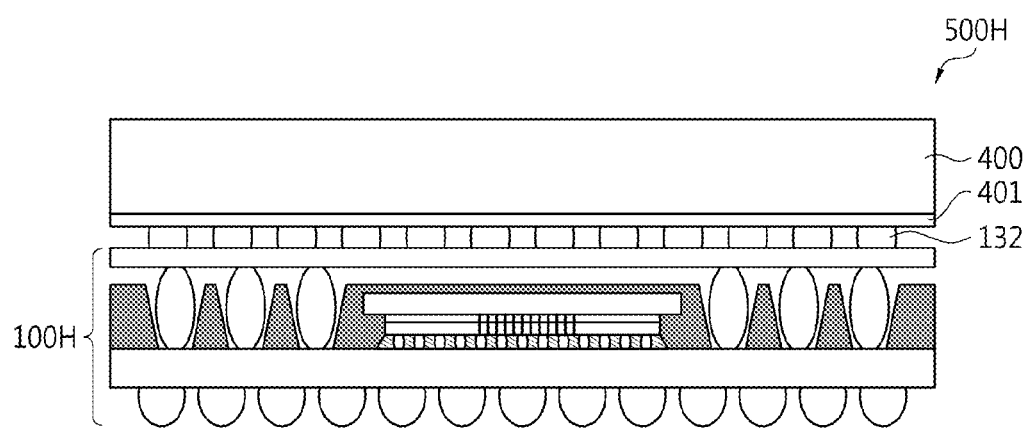
FIG. 33 is a cross-sectional view of an SOP according to examples of the present inventive concept which includes the first package shown in FIG. 32.

FIG. 32 is a cross-sectional view of a first package according to examples of the present inventive concept, and FIG. 33 is a cross-sectional view of an SOP according to examples of the present inventive concept which includes the first package shown in FIG. 32.

Referring to FIGS. 12 and 32, except that the interposer substrate 130 is present and the stack connection solder balls 120 are connected to the interposer substrate 130, the first package 100C shown in FIG. 12 is the same as or similar to a first package 100H of FIG. 32 in configuration. That is, the first package 100H may include the interposer substrate 130, and the first package 100H may be a SiP. The first package 100H may be a CUF-mold-LDP-interposer-SiP.

The interposer substrate 130 may be connected to the first PCB 103 through the stack connection solder balls 120. The second package 400 including the semiconductor substrate 401 may be connected to the interposer substrate 130 through metal balls, e.g., the stack connection solder balls 132. An empty space may be present between a surface of the protection material 118A and the interposer substrate 130. Each joint ball map described referring to FIGS. 20 to 29 may be applied to an SoP 500H including the interposer substrate 130. The SoP 500H may include the first package 100H, the interposer substrate 130 stacked on the first package 100H, and the second package 400 stacked on the interposer substrate 130. The SoP 500H may be a CUF-mold-LDP-interposer-SoP.

Figure 34:
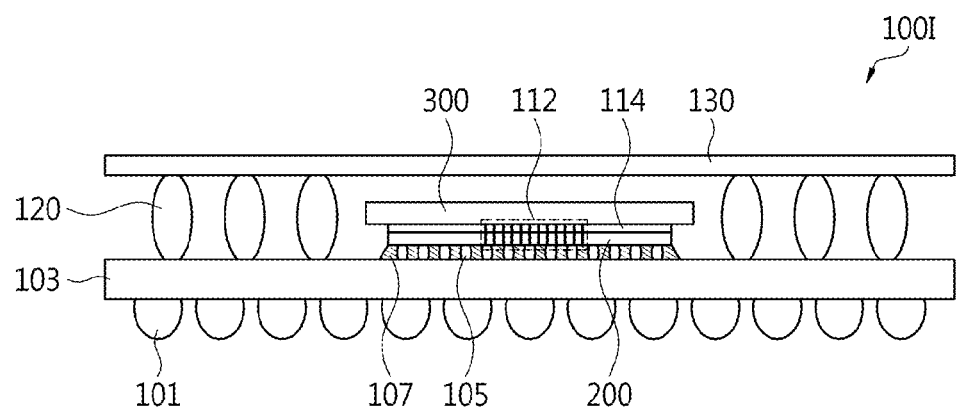
FIG. 34 is a cross-sectional view of a first package according to examples of the present inventive concept.
Figure 35:
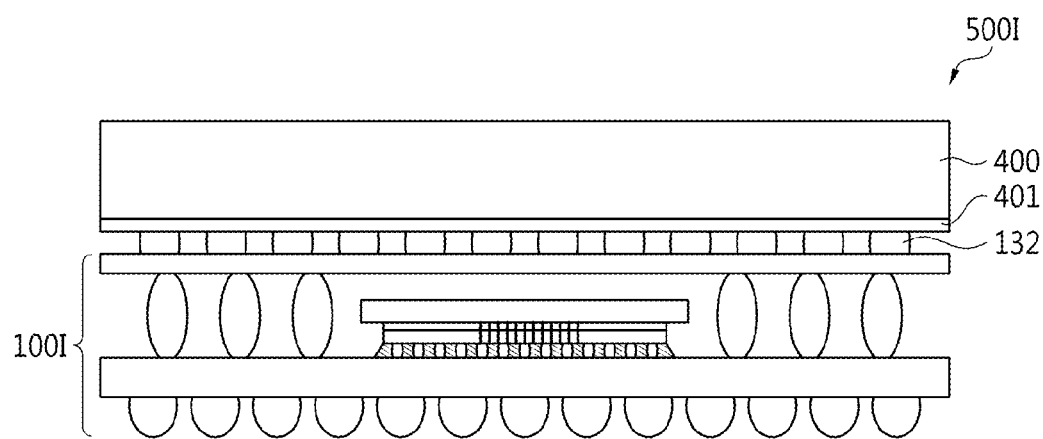
FIG. 35 is a cross-sectional view of an SOP according to examples of the present inventive concept which includes the first package shown in FIG. 34.

FIG. 34 is a cross-sectional view of a first package according to examples of the present inventive concept, and FIG. 35 is a cross-sectional view of an SoP according to examples of the present inventive concept which includes the first package shown in FIG. 34.

Referring to FIGS. 14 and 34, except that the interposer substrate 130 is present and the stack connection solder balls 120 are connected to the interposer substrate 130, the first package 100D shown in FIG. 14 is the same as or similar to a first package 100I of FIG. 34 in configuration. That is, the first package 100I includes the interposer substrate 130 and the first package 100I may be a SiP. The first package 100I may be a CUF-interposer-SiP.

The interposer substrate 130 may be connected to the first PCB 103 through the stack connection solder balls 120. The second package 400 including the semiconductor substrate 401 may be connected to the interposer substrate 130 through metal balls, e.g., the stack connection solder balls 132. An empty space may be present between the bottom surface of the first memory device 300 and the interposer substrate 130. An SoP 500I may include the first package 100I, the interposer substrate 130 stacked on the first package 100I, and the second package 400 stacked o the interposer substrate 130. The SoP 500I may be a CUF-interposer-SoP.

Figure 36:
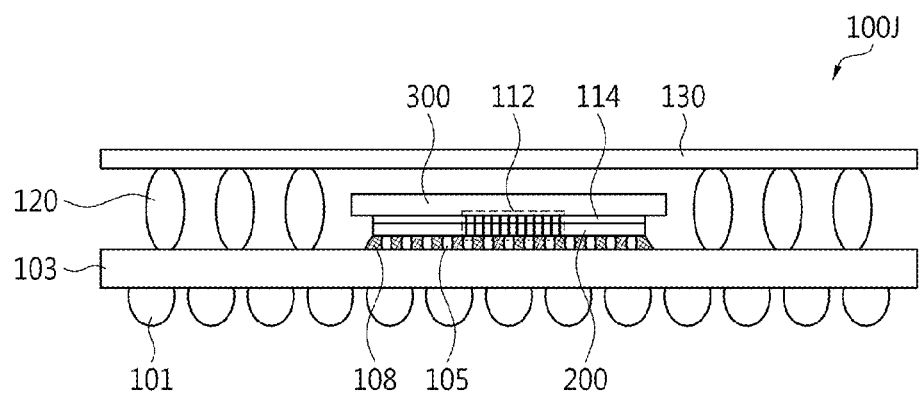
FIG. 36 is a cross-sectional view of a first package according to examples of the present inventive concept.
Figure 37:
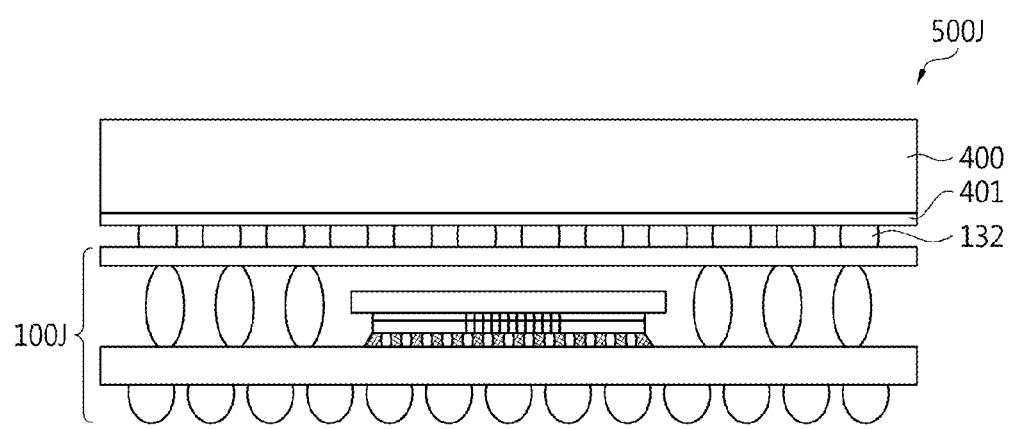
FIG. 37 is a cross-sectional view of an SOP according to examples of the present inventive concept which includes a first package shown in FIG. 36.

FIG. 36 is a cross-sectional view of a first package according to examples of the present inventive concept, and FIG. 37 is a cross-sectional view of an SoP according to examples of the present inventive concept which includes the first package shown in FIG. 36.

Referring to FIGS. 16 and 36, except that the interposer substrate 130 is present and the stack connection solder balls 120 are connected to the interposer substrate 130, the first package 100E shown in FIG. 16 is the same as or similar to a first package 100J of FIG. 36 in configuration. That is, the first package 100J includes the interposer substrate 130 and the first package 100J may be a SiP. The first package 100J may be a TC NCP/TC NCF-interposer-SiP.

An empty space may be present between the bottom surface of the first memory device 300 and the interposer substrate 130. An SOP 500J may include the first package 100J, the interposer substrate 130 stacked on the first package 100J, and the second package 400 stacked o the interposer substrate 130. The SoP 500J may be a TC NCP/TC NCF-interposer-SoP.

Figure 38:
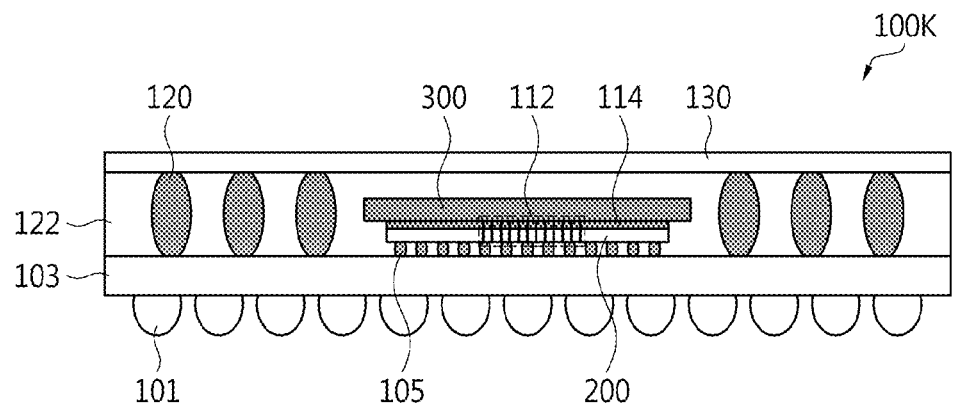
FIG. 38 is a cross-sectional view of a first package according to examples of the present inventive concept.
Figure 39:
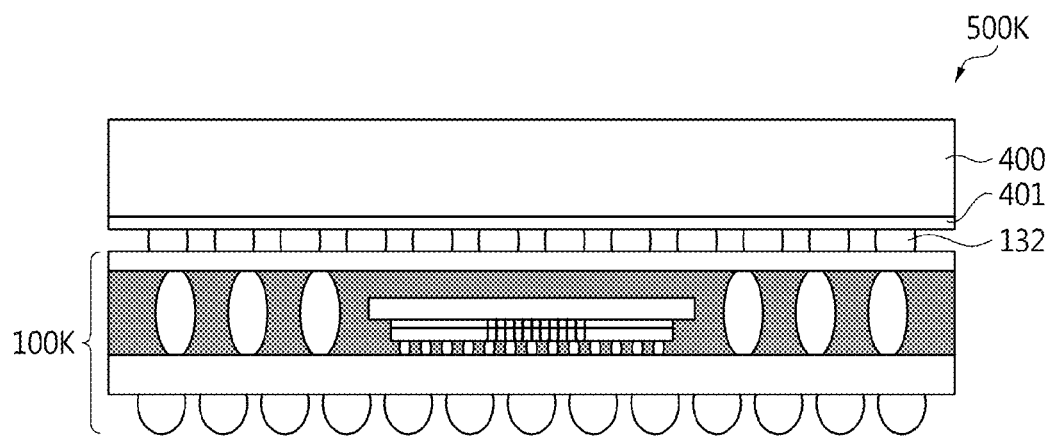
FIG. 39 is a cross-sectional view of an SOP according to examples of the present inventive concept which includes the first package shown in FIG. 38.

FIG. 38 is a cross-sectional view of a first package according to examples of the present inventive concept, and FIG. 39 is a cross-sectional view of an SoP according to examples of the present inventive concept which includes the first package shown in FIG. 38. Referring to FIG. 38, a first package 100K includes the interposer substrate 130 and the first package 100K may be a SiP. The first package 100K may be an MUF-interposer-SiP.

The SoC 200 may be electrically connected to the first PCB 103 through the bumps 105, the first memory device 300 may be connected to a bottom surface of the SoC 200 using the adhesive 114, and the interposer substrate 130 may be electrically connected to the first PCB 103 through the stack connection solder balls 120. An empty space between the first PCB 103 and the interposer substrate 130 may be completely filled with a protection material 122. The protection material 122 may be embodied in EMC; however, it is not limited thereto. An SoP 500K may include the first package 100K, the interposer substrate 130 stacked on the first package 100K, and the second package 400 stacked on the interposer substrate 130. The SOP 500K may be an MUF-interposer-SoP.

Referring to FIGS. 30 and 38, an empty space is present between the first PCB 103 and the interposer substrate 130 in the first package 100G of FIG. 30; however, an empty space between the first PCB 103 and the interposer substrate 130 is completely filled with the protection material 122 in the first package 100K of FIG. 38.

Figure 40:
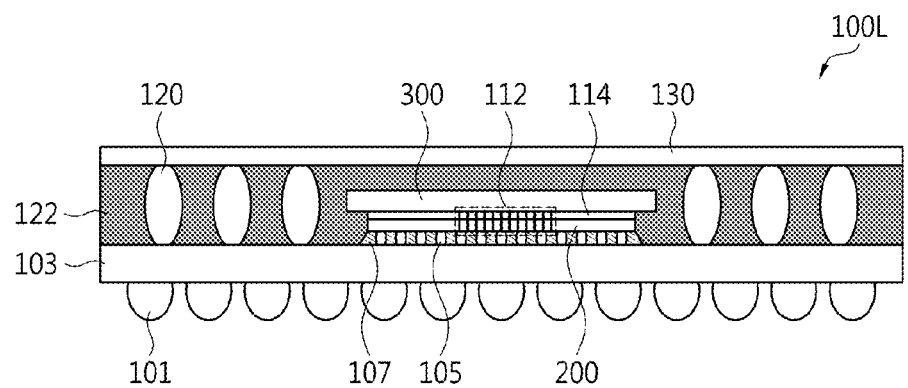
FIG. 40 is a cross-sectional view of a first package according to examples of the present inventive concept.
Figure 41:
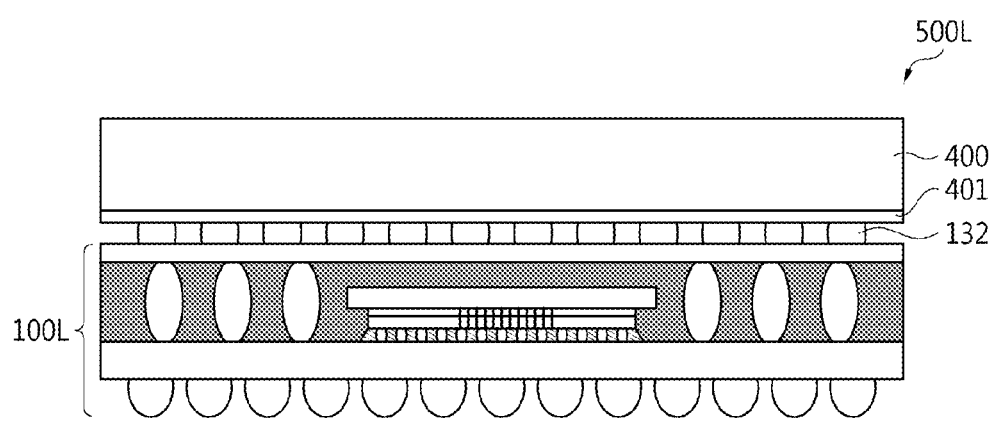
FIG. 41 is a cross-sectional view of an SOP according to examples of the present inventive concept which includes the first package shown in FIG. 40.

FIG. 40 is a cross-sectional view of a first package according to examples of the present inventive concept, and FIG. 41 is a cross-sectional view of an SoP according to examples of the present inventive concept which includes the first package shown in FIG. 40.

Referring to FIGS. 32 and 40, an empty space is present between the first PCB 103 and the interposer substrate 130 in the first package 100H of FIG. 32; however, an empty space between the first PCB 103 and the interposer substrate 130 is completely filled with the protection material 122 in a first package 100L of FIG. 40.

Referring to FIG. 40, the first package 100L may be a SiP. The first package 100L may be CUF-mold-interposer-SiP. An SOP 500L may include the first package 100L, the interposer substrate 130 stacked on the first package 100L, and the second package 400 stacked on the interposer substrate 130. The SOP 500L may be a CUF-mold-interposer-SoP.

Figure 42:
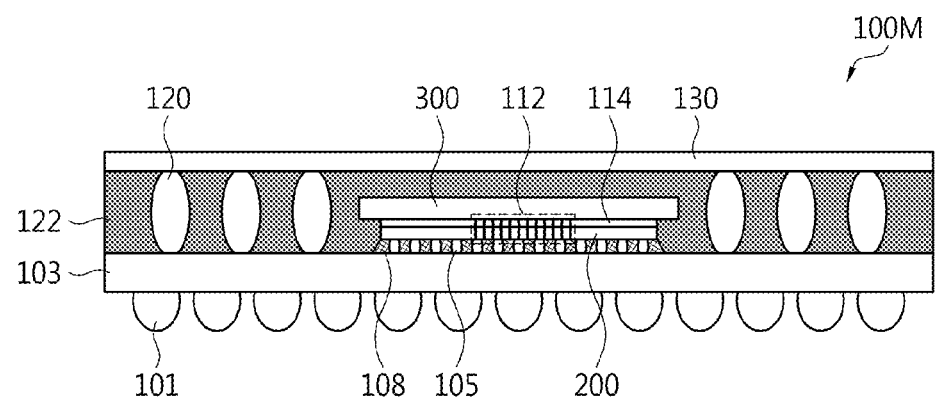
FIG. 42 is a cross-sectional view of a first package according to examples of the present inventive concept.
Figure 43:
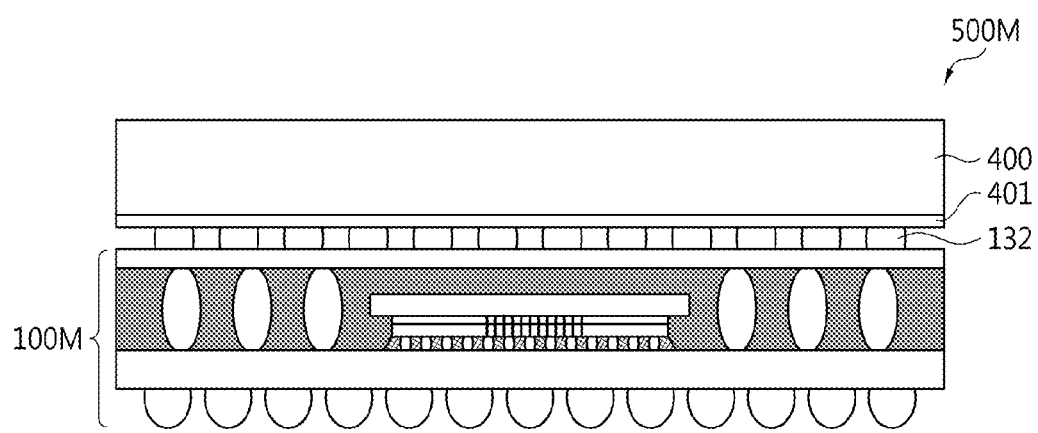
FIG. 43 is a cross-sectional view of an SOP according to examples of the present inventive concept which includes the first package shown in FIG. 42.

FIG. 42 is a cross-sectional view of a first package according to examples of the present inventive concept, and FIG. 43 is a cross-sectional view of an SoP according to examples of the present inventive concept which includes the first package shown in FIG. 42.

Referring to FIGS. 36 and 42, an empty space is present between the first PCB 103 and the interposer substrate 130 in the first package 100J of FIG. 36; however, an empty space between the first PCB 103 and the interposer substrate 130 is completely filled with the protection material 122 in a first package 100M of FIG. 42. Referring to FIG. 42, the first package 100M may be a SiP. The first package 100M may be a TC NCP/TC NCF-mold-interposer-SiP. The SOP 500M may include the first package 100M, the interposer substrate 130 stacked on the first package 100M, and the second package 400 stacked on the interposer substrate 130. The SoP 500M may be a TC NCP/TC NCF-mold-interposer-SOP.

Figure 44:
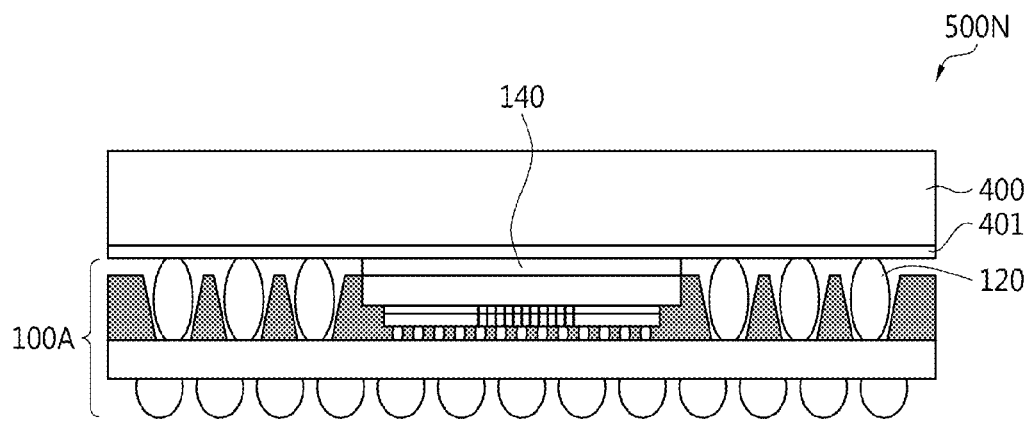
FIG. 44 is a cross-sectional view of an SOP according to examples of the present inventive concept which includes the first package shown in FIG. 4.

FIG. 44 is a cross-sectional view of an SoP according to examples of the present inventive concept which includes the first package shown in FIG. 4.

Except for an adhesive material 140, the first package 100A of FIG. 4 is the same as or similar to a first package 100A of FIG. 44 in configuration. When the first package 100A and the second package 400 are connected to each other through the stack connection solder balls 120, the adhesive material 140 may bond or fix the second package 400 to the first package 100A. For example, the adhesive material 140 may bond or fix the semiconductor substrate 401 of the second package 400 to a bottom surface of the first memory device 300. The adhesive material 140 may be a liquid-type adhesive or a film-type adhesive. The SoP 500N may include the first package 100A and the second package 400 bonded to each other through the adhesive material 140. The SoP 500N may be a gap-filled-eMUF-LDP-SoP.

Figure 45:
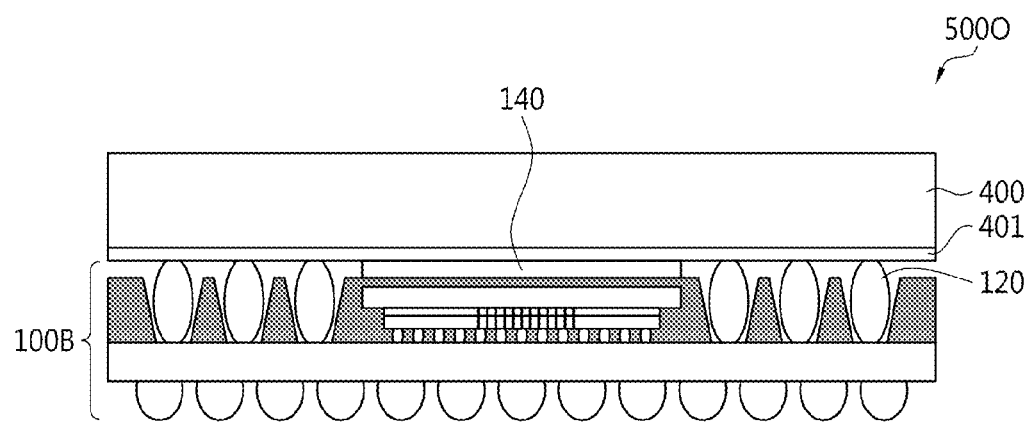
FIG. 45 is a cross-sectional view of an SOP according to examples of the present inventive concept which includes the first package shown in FIG. 10.

FIG. 45 is a cross-sectional view of an SoP according to examples of the present inventive concept which includes the first package shown in FIG. 10. Except for the adhesive material 140, the first package 100B of FIG. 10 is the same as or similar to a first package 100B of FIG. 45 in configuration. An SoP 500O may include the first package 100B and the second package 400 bonded to each other through the adhesive material 140. The SOPP 500O may be a gap-filled-MUF-LDP-SoP.

Figure 46:
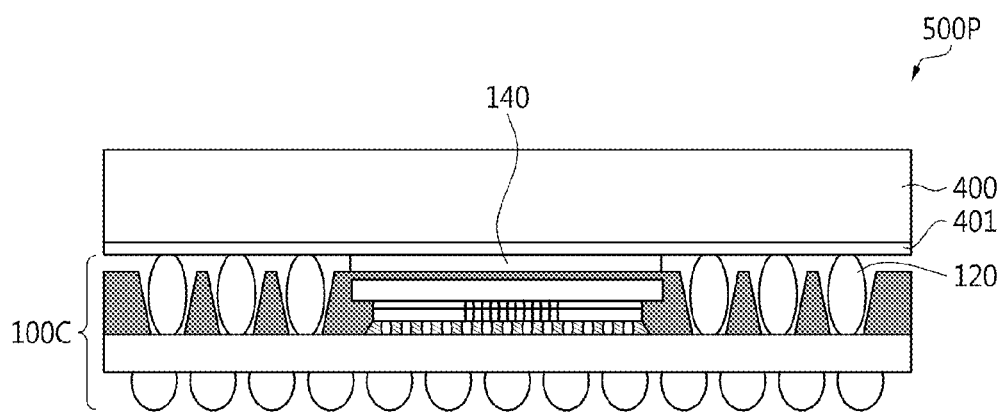
FIG. 46 is a cross-sectional view of an SOP according to examples of the present inventive concept which includes the first package shown in FIG. 12.

FIG. 46 is a cross-sectional view of an SoP according to examples of the present inventive concept which includes the first package shown in FIG. 12. Except for the adhesive material 140, the first package 100C of FIG. 12 is the same as or similar to a first package 100C of FIG. 46 in configuration. The SOP 500P may include the first package 100C and the second package 400 bonded to each other through the adhesive material 140. The SOP 500P may be a gap-filled-CUF-mold-LDP-SoP.

Figure 47:
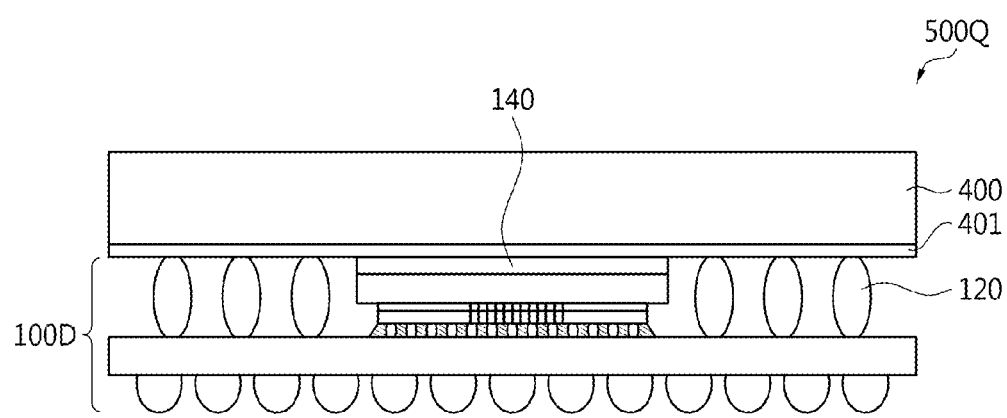
FIG. 47 is a cross-sectional view of an SOP according to examples of the present inventive concept which includes the first package shown in FIG. 14.

FIG. 47 is a cross-sectional view of an SoP according to examples of the present inventive concept which includes the first package shown in FIG. 14.

Except for the adhesive material 140, the first package 100D of FIG. 14 is the same as or similar to a first package 100D of FIG. 47 in configuration. An SoP 500Q may include the first package 100D and the second package 400 bonded to each other through the adhesive material 140. The SoP 500Q may be a gap-filled-CUF-SoP.

Figure 48:
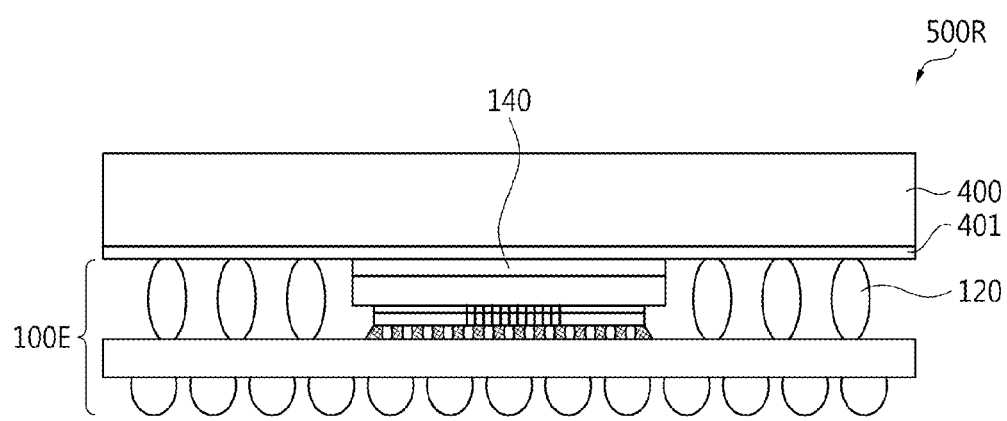
FIG. 48 is a cross-sectional view of an SOP according to examples of the present inventive concept which includes the first package shown in FIG. 16.

FIG. 48 is a cross-sectional view of an SoP according to examples of the present inventive concept which includes the first package shown in FIG. 16. Except for the adhesive material 140, the first package 100E of FIG. 16 is the same as or similar to a first package 100E of FIG. 48 in configuration. An SoP 500R may include the first package 100E and the second package 400 bonded to each other through the adhesive material 140. The SoP 500R may be a gap-filled-TC NCP/TC NCF-SOP.

Figure 49:
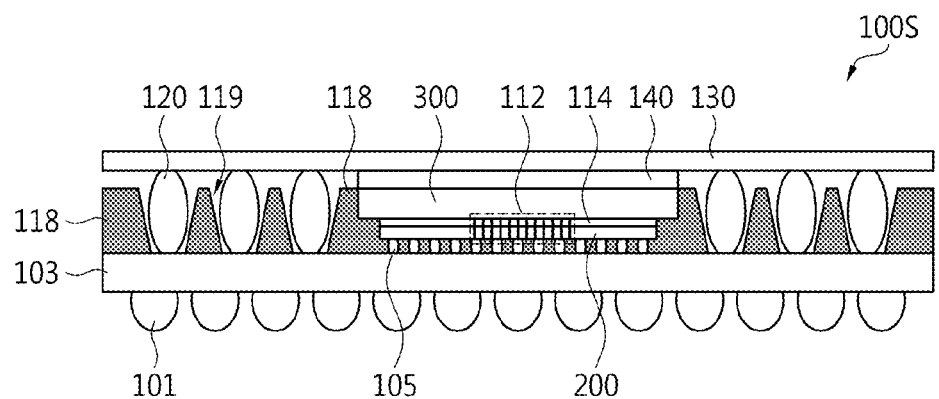
FIG. 49 is a cross-sectional view of a first package according to examples of the present inventive concept.

FIG. 49 is a cross-sectional view of a first package according to examples of the present inventive concept. Referring to FIGS. 18 and 49, except for the adhesive material 140, the first configuration 100F of FIG. 18 is the same as or similar to a first package 100S of FIG. 49 in configuration. The adhesive material may bond or fix the bottom surface of the first memory device 300 to the interposer substrate 130. The first package 100S may be a gap-filled-eMUF-LDP-interposer-SiP.

Figure 50:
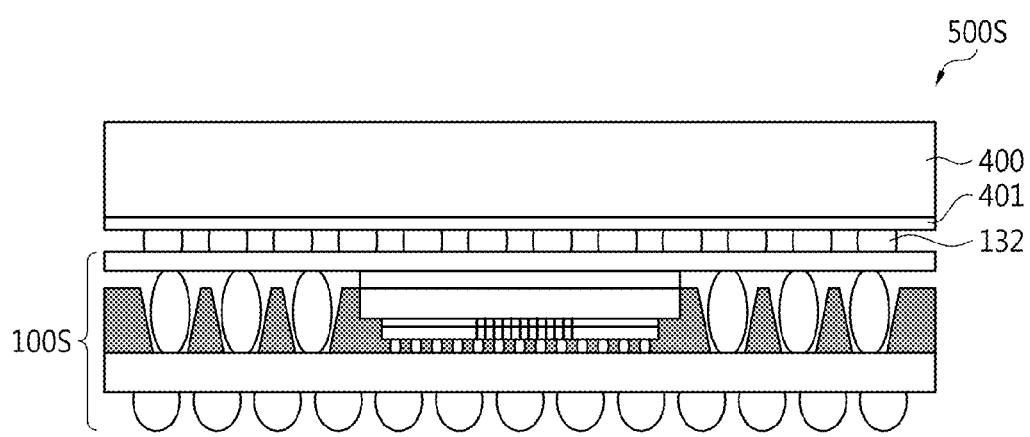
FIG. 50 is a cross-sectional view of an SOP according to examples of the present inventive concept which includes the first package shown in FIG. 49.

FIG. 50 is a cross-sectional view of an SoP according to examples of the present inventive concept which includes the first package shown in FIG. 49. An SoP 500S may include the first package 100S, the interposer substrate 130 stacked on the first package 100S through the stack connection solder balls 120 and the adhesive material 140, and the second package 400 stacked on the interposer substrate 130. The SoP 500S may be a gap-filled-eMUF-LDP-interposer-SOP.

Figure 51:
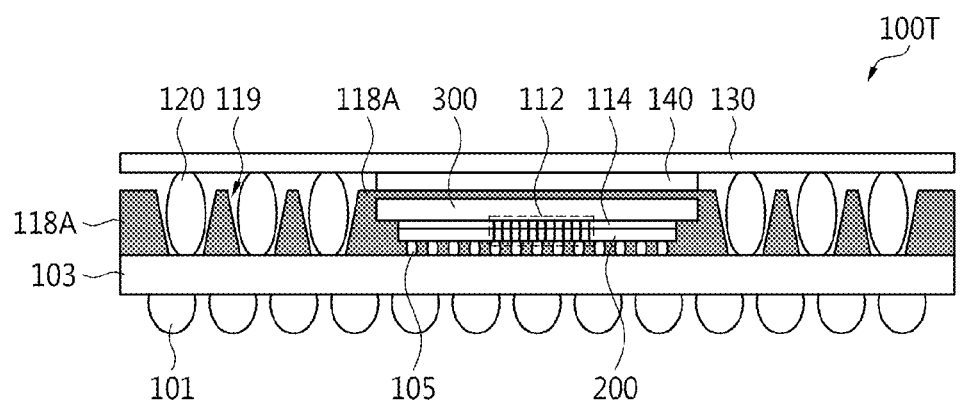
FIG. 51 is a cross-sectional view of a first package according to examples of the present inventive concept.
Figure 52:
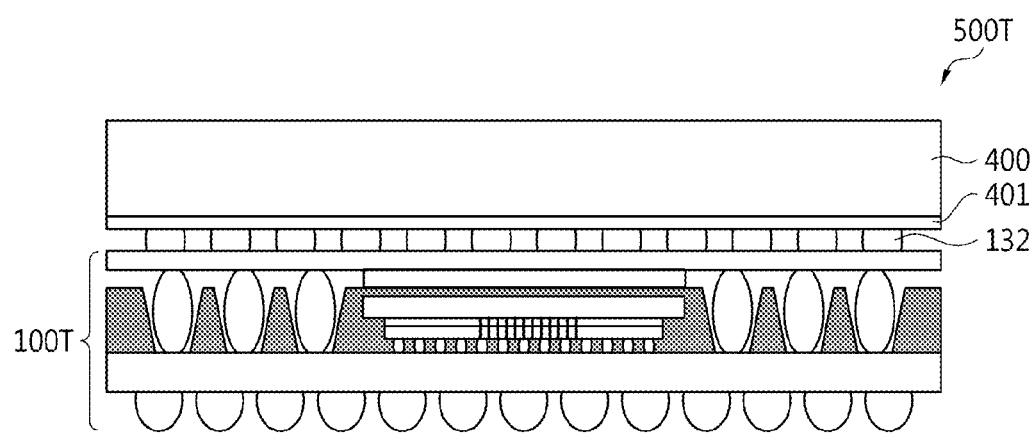
FIG. 52 is a cross-sectional view of an SOP according to examples of the present inventive concept which includes the first package shown in FIG. 41.

FIG. 51 is a cross-sectional view of a first package according to examples of the present inventive concept, and FIG. 52 is a cross-sectional view of an SoP according to examples of the present inventive concept which includes the first package shown in FIG. 51. Referring to FIGS. 30 and 51, except for the adhesive material 140, the first package 100G of FIG. 30 is the same as or similar to a first package 100T of FIG. 51 in configuration. The adhesive material 140 may bond or fix the protection material 118A and the interposer substrate 130. The first package 100S may be a gap-filled-MUF-LDP-interposer-SiP.

An SoP 500T may include the first package 100T, the interposer substrate 130 stacked on the first package 100T through the stack connection solder balls 120 and the adhesive material 140, and the second package 400 stacked on the interposer substrate 130. The SoP 500T may be a gap-filled-MUF-LDP-interposer-SoP.

Figure 53:
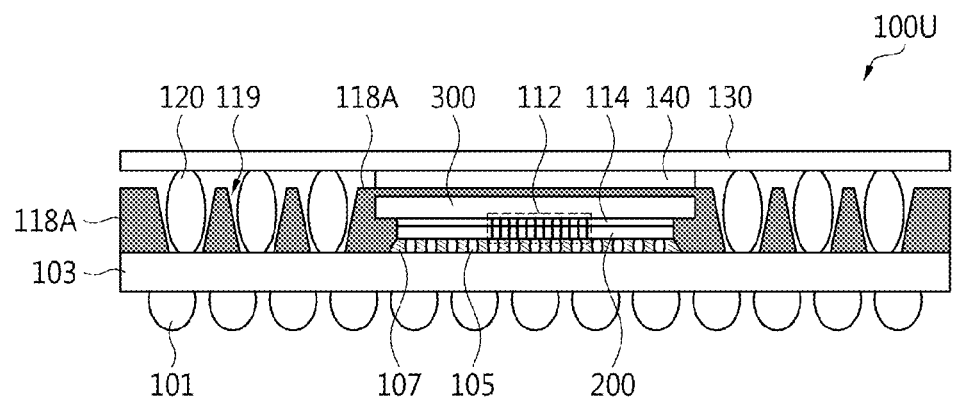
FIG. 53 is a cross-sectional view of a first package according to examples of the present inventive concept.
Figure 54:
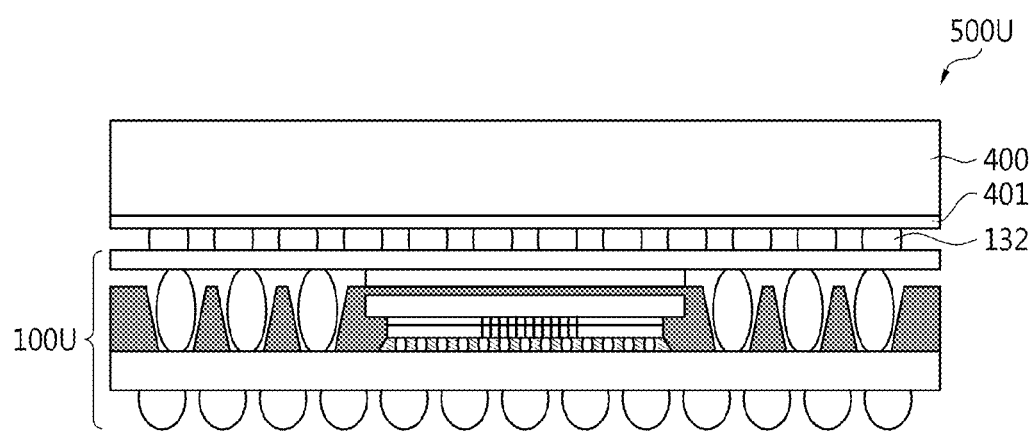
FIG. 54 is a cross-sectional view of an SOP according to examples of the present inventive concept which includes the first package shown in FIG. 53.

FIG. 53 is a cross-sectional view of a first package according to examples of the present inventive concept, and FIG. 54 is a cross-sectional view of an SoP according to examples of the present inventive concept which includes the first package shown in FIG. 53.

Referring to FIGS. 32 and 53, except for the adhesive material 140, the first package 100H of FIG. 32 is the same as or similar to a first package 100U of FIG. 53 in configuration. The adhesive material 140 may bond or fix the protection material 118A and the interposer substrate 130. The first package 100S may be a gap-filled CUF-mold-LDP-interposer-SiP. The SOP 500U may include the first package 100U, the interposer substrate 130 stacked on the first package 100U through the stack connection solder balls 120 and the adhesive material 140, and the second package 400 stacked on the interposer substrate 130. The SoP 500U may be a gap-filled-CUF-mold-LDP-interposer-SOP.

Figure 55:
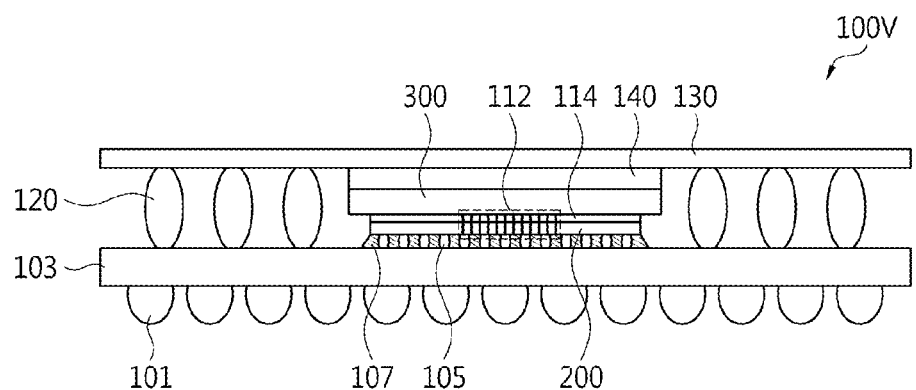
FIG. 55 is a cross-sectional view of a first package according to examples of the present inventive concept.
Figure 56:
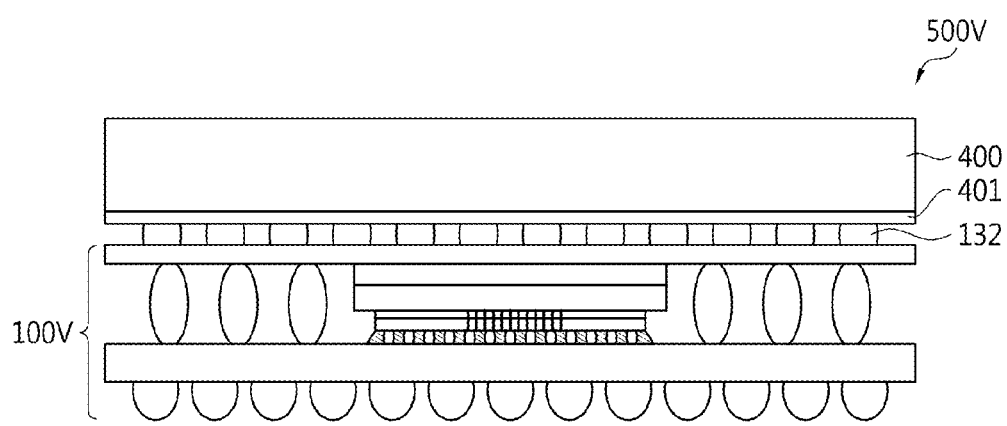
FIG. 56 is a cross-sectional view of an SOP according to examples of the present inventive concept which includes the first package shown in FIG. 55.

FIG. 55 is a cross-sectional view of a first package according to examples of the present inventive concept, and FIG. 56 is a cross-sectional view of an SOP according to examples of the present inventive concept which includes the first package shown in FIG. 55.

Referring to FIGS. 34 and 55, except for the adhesive material 140, the first package 100I of FIG. 34 is the same as or similar to a first package 100V of FIG. 55 in configuration. The adhesive material 140 may bond or fix the bottom surface of the first memory device 300 and the interposer substrate 130. The first package 100V may be a gap-filled CUF-interposer-SiP.

An SoP 500V may include the first package 100V, the interposer substrate 130 stacked on the first package 100V through the stack connection solder balls 120 and the adhesive material 140, and the second package 400 stacked on the interposer substrate 130. The SoP 500V may be a gap-filled-CUF-interposer-SoP.

Figure 57:
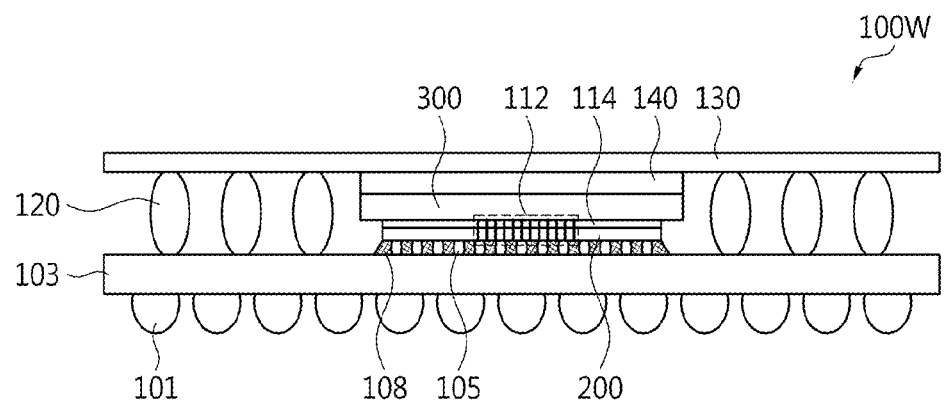
FIG. 57 is a cross-sectional view of a first package according to examples of the present inventive concept.
Figure 58:
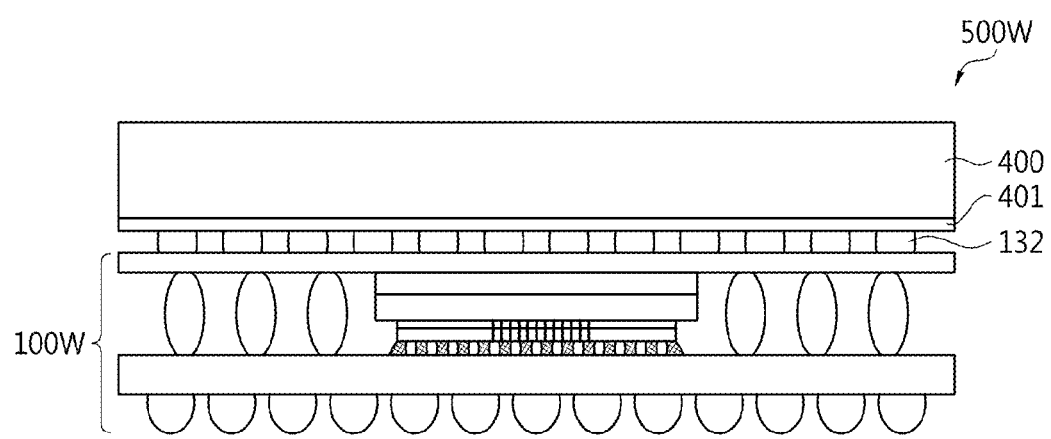
FIG. 58 is a cross-sectional view of an SOP according to examples of the present inventive concept which includes the first package shown in FIG. 51.

FIG. 57 is a cross-sectional view of a first package according to examples of the present inventive concept, and FIG. 58 is a cross-sectional view of an SoP according to examples of the present inventive concept which includes the first package shown in FIG. 57. Referring to FIGS. 36 and 57, except for the adhesive material 140, the first package 100J of FIG. 36 is the same as or similar to a first package 100W of FIG. 57 in configuration. The adhesive material 140 may bond or fix the bottom surface of the first memory device 300 and the interposer substrate 130. The first package 100W may be a gap-filled TC NCP/TC NCF-interposer-SiP.

An SoP 500W may include the first package 100W, the interposer substrate 130 stacked on the first package 100W through the stack connection solder balls 120 and the adhesive material 140, and the second package 400 stacked on the interposer substrate 130. The SOP 500W may be a gap-filled TC NCP/TC NCF-interposer-SOP.

Figure 59:
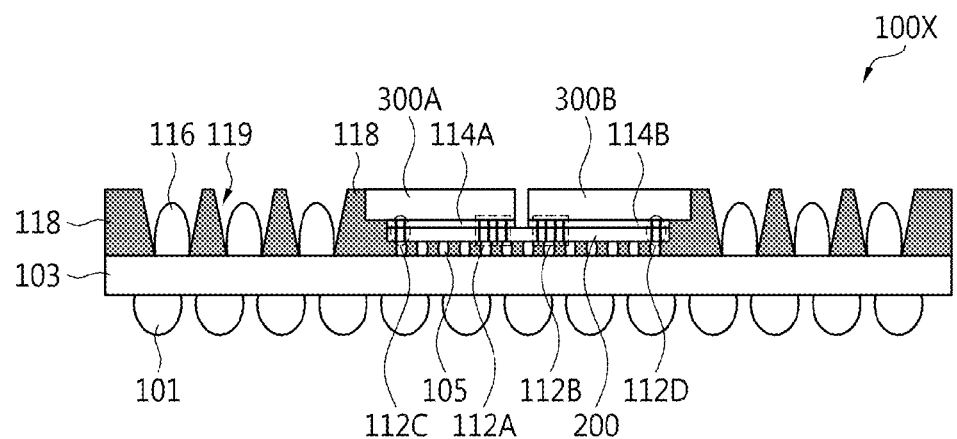
FIG. 59 is a cross-sectional view of a first package according to examples of the present inventive concept.

FIG. 59 is a cross-sectional view of a first package according to examples of the present inventive concept. Referring to FIGS. 1 and 59, a first package 100X may be embodied in a SiP.

A first DRAM chip 300A may be bonded to the SoC 200 through a first adhesive 114A, a second DRAM chip 300B (i.e., a third memory chip of the SoP 100x in this example) may be bonded to the SoC 200 through a second adhesive 114B laterally of the first DRAM chip 300A, and each of the DRAM chips 300A and 300B does not include TSVs. The SoC 200 may include first TSVs 112A and second TSVs 112B. First micro bumps disposed in the first DRAM chip 300A may be connected to the first TSVs 112A, and second micro bumps disposed in the second DRAM chip 300B may be connected to second TSVs 112B. An operation voltage, a ground voltage, and signals may be transmitted through the TSVs 112A and 112B. An operation voltage and a ground voltage may be supplied through TSVs 112C and 112D.

A first package 100X including the SoC 200 and the DRAM chips 300A and 300B may be embodied in or changed to various types of SiP described referring to FIGS. 4 to 58. Moreover, an SoP including the first package 100X may be embodied in or changed to various types of SoP described referring to FIGS. 4 to 58.

Figure 60:
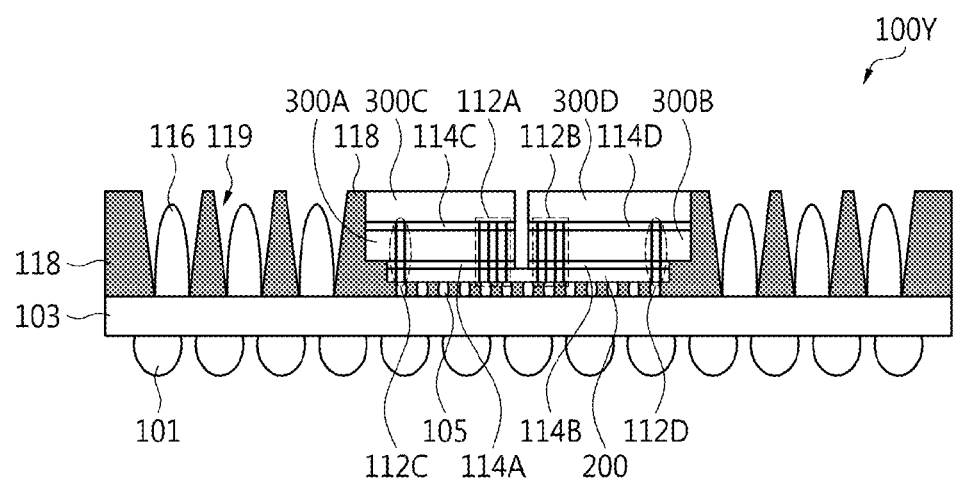
FIG. 60 is a cross-sectional view of a first package according to examples of the present inventive concept.

FIG. 60 is a cross-sectional view of a first package according to examples of the present inventive concept. Referring to FIGS. 1 and 60, a first package 100Y may be embodied in an SiP.

A first DRAM chip 300A may be bonded to the SoC 200 through a first adhesive 114A, a second DRAM chip 300B may be bonded to the SoC 200 through a second adhesive 114B, a third DRAM chip 300C may be bonded to the first DRAM chip 300A through a third adhesive 114C and mounted thereto in a flip chip manner, and the fourth DRAM chip 300D may be bonded to the second DRAM chip 300B through a fourth adhesive 114D and mounted thereto in a flip chip manner. In this example, the chip 300A is interposed between the SoC 200 and the chip 300C, and the chip 300B is interposed between the SoC 200 and the chip 300D.

The DRAM chips 300A and 300B may have first TSVs 112A and second TSVs 112B extending therethrough, respectively. However, each of the DRAM chips 300C and 300D does not include TSVs. The SoC 200 may have the first TSVs 112A and the second TSVs 112B extending therethrough. The SoC 200 may transmit or receive an instruction and/or data to or from each of the DRAM chips 300A and 300C through the first TSVs 112A. The SoC 200 may transmit or receive an instruction and/or data to or from each of the DRAM chips 300B and 300D through the second TSVs 112B.

The first micro bumps of the third DRAM chip 300C may be connected to the first TSVs 112A, and the second micro bumps of the second DRAM chip 300D may be connected to the second TSVs 112B.

The first package 100Y including the SoC 200 and the DRAM chips 300A, 300B, 300C, and 300D may be embodied in or changed to various types of SiP described referring to FIGS. 4 to 58. Moreover, an SoP including the first package 100Y may be embodied in or changed to various types of SOP described referring to FIGS. 4 to 58.

Figure 61:
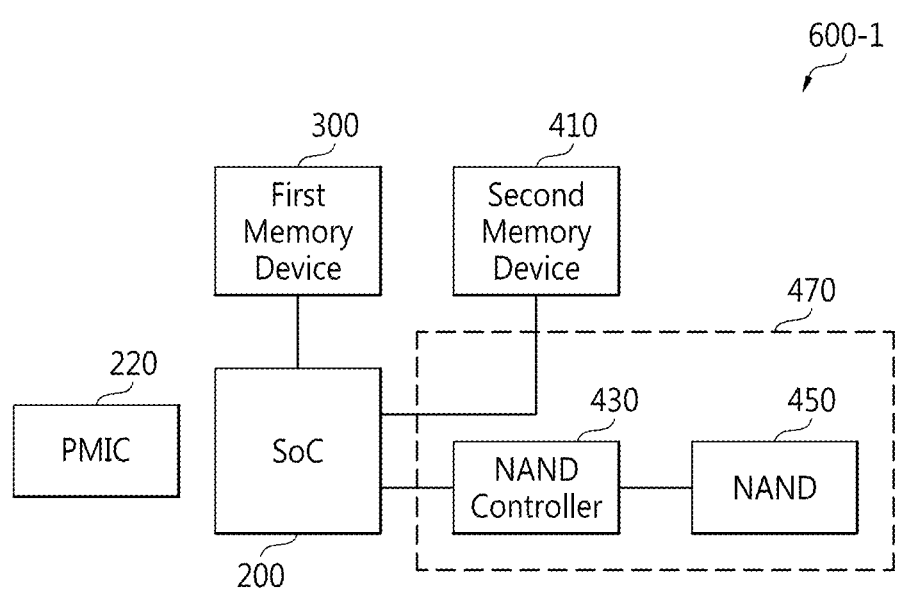
FIG. 61 is a functional block diagram of an electronic system according to examples of the present inventive concept.

FIG. 61 is a functional block diagram of an electronic system according to examples of the present inventive concept. Referring to FIG. 61, an electronic system 600-1 may include the controller 200, the first memory device 300, the second memory device 410, the memory controller 430, and the third memory device 450. The electronic system 600-1 may further include a PMIC 220 which supplies an operation voltage(s) to each of the components 200, 300, 410, 430, and 450.

Unlike the electronic system 600 shown in FIG. 1, a third package 470 in the electronic system 600-1 shown in FIG. 61 may include the memory controller 430 and the third memory device 450. For example, the controller 200 and the first memory device 300 may be packaged in a first package, and the second memory device 410 may be packed in a second package.

A system on package according to examples of the present inventive concept includes a first package and a second package stacked on each other in a package on package configuration, and the system on package can be attached to a board of an electronic system set. The first package includes a system on chip and a first DRAM device which is connected to the system on chip through vertical vias, and the second package includes a second DRAM device, and may additionally include a flash-based memory device, and a memory controller for controlling the flash-based memory device.

A system on package according to examples of the present inventive concept can have a high bandwidth and a high density. The system on package according to examples of the present inventive concept can improve performance of an electronic system including the system on package. The system on package according to examples of the present inventive concept may be embodied to be small and thin, thereby lowering a manufacturing cost of the system on package.

Although a few examples of the present general inventive concept have been shown and described, it will be appreciated by those skilled in the art that changes may be made in these examples without departing from the principles and spirit of the general inventive concept, the scope of which is defined by the appended claims.

What is claimed is:

1. A system on package (SoP), comprising:
   a first package;
   a second package disposed on the first package so as to be stacked therewith; and
   electrical contacts interposed between and electrically connecting the first and second packages,
   wherein the first package includes:
   a first printed circuit board (PCB);
   a system on chip (SoC) having through-vias extending vertically therethrough;
   conductive bumps electrically connecting the SoC to the first PCB; and
   a first memory device having micro bumps electrically connected to the through-vias to thereby electrically connect the first memory device to the SoC, and
   wherein the second package includes:
   a second PCB of the SoP;
   a second memory device of the SoP electrically connected to the second PCB;
   a third memory device of the SoP electrically connected to the second PCB; and
   a memory controller which is electrically connected to the second PCB and is operatively electrically connected to the third memory device to control the third memory device.

2. The system on package of claim 1, wherein the SoC is a controller configured to allocate first software requiring a first processing speed and/or first data related to the first software to the first memory device, to allocate second software requiring a second processing speed slower than the first processing speed and/or second data related to the second software to the second memory device, and to allocate third software requiring a third processing speed slower than the second processing speed and/or third data related to the third software to the third memory device.

3. The system on package of claim 2, wherein each of the first memory device and the second memory device is a dynamic random access memory, the third memory device is a storage memory device, and a bandwidth of the first memory device is larger than a bandwidth of the second memory device.

4. The system on package of claim 3, wherein the bandwidths of each of the first and second memory devices are fixed.

5. The system on package of claim 3, wherein the first memory device is configured with a plurality of first chunks and the second memory device is configured with a plurality of second chunks, the chunks all being of the same size, and
   the SoC is configured to borrow the second chunks from the second memory device to supplement the bandwidth and density of the first memory device.

6. The system on package of claim 1, wherein the memory controller has an interface supporting an embedded multimedia card or universal flash storage.

7. The system on package of claim 1, wherein the first package is a system-in-package (SiP), such that the first package and the second package together constitute a package on package (PoP).

8. The system on package of claim 1, wherein the SoC has a rectangular footprint so as to have four corners and four sides, first physical layers for communication with the second memory device and which interface with the second memory device at two of the four sides of the SoC, and a second physical layer for communication with the memory controller and which interfaces with the memory controller at another of the four sides, and
   wherein the through-vias are disposed at a center of the SoC.

9. The system on package of claim 8, wherein the electrical contacts connect the first PCB and the second PCB and include respective contacts dedicated to transmit commands or addresses output from the first physical layers to the second memory device, said respective contacts being disposed adjacent the center of each of the four sides of the SoC or adjacent each of the four corners of the SoC.

10. The system on package of claim 1, wherein the first memory device has only one memory chip or a plurality of memory chips stacked one on another.

11. The system on package of claim 1, further comprising molding material which occupies a portion or all of the space between the first PCB and the second PCB.

12. The system on package of claim 1, further comprising an interposer substrate which is interposed between and connected to the first package and the second package.

13. The system on package of claim 12, further comprising molding material which occupies a portion or all the space between the first PCB and the interposer substrate.

14. The system on package of claim 12, further comprising adhesive between the first memory device and the interposer substrate.

15. A system on package (SoP), comprising:
   a first package including a first printed circuit board (PCB) of the SoP, a controller disposed on an upper surface of the first PCB, and a first memory chip of the SoP stacked on the controller;
   a second package stacked on the first package and including a second printed circuit board (PCB) of the SoP, and a stack of chips disposed on an upper surface of and electrically connected to the second PCB; and an array of electrical contacts interposed between the upper surface of the first PCB and a bottom surface of the second PCB and electrically connecting the first and second PCBs to one another, and wherein the memory chip of the first package is disposed on and connected to the controller with a flip chip connection such that an active surface of the memory chip of the first package faces in a direction towards the controller, the stack of chips of the second package includes a second memory chip of the SoP, and the controller is electrically connected to the first memory chip by the flip chip connection, electrically connects the first memory chip to the first PCB, is electrically connected to the stack of chips of the second package by the first PCB and the electrical contacts, and is configured to control operations of the first and second memory chips.

16. The system on package of claim 15, wherein a system on chip (SoC) constitutes the controller, and the SoC has through-vias extending vertically therethrough and electrically connected to the first memory chip and the first PCB.

17. The system on package of claim 15, wherein each of the first and second memory chips is a dynamic random access memory (DRAM) chip, the first memory device has a larger bandwidth than the second memory device, the second package further comprises a non-volatile memory and a memory controller, and the memory controller is operatively connected to the non-volatile memory to control an operation of the non-volatile memory.

18. The system on package of claim 15, wherein the first memory chip is mounted and electrically connected directly to the controller with the flip chip connection, and the first package further comprises a third DRAM chip of the SoP disposed on the controller laterally of the first memory chip and mounted and electrically connected directly to the controller with a flip chip connection.

19. The system on package of claim 15, wherein the first package further comprises a third memory chip of the SoP interposed between the controller and the first memory chip, the first memory chip is mounted and electrically connected directly to the third memory chip with the flip chip connection, and the third memory chip has through-vias extending vertically therethrough and electrically connecting the first memory chip to the controller.

20. The system on package of claim 15, wherein the first PCB is rectangular, and the first memory chip and the controller are disposed on a central portion of the first PCB, and at least one row of the electrical contacts extends along each of the sides of the first PCB such that the array of electrical contacts surrounds the central portion of the first PCB.

* * * * *